(12) United States Patent
Kawasaki

(10) Patent No.: US 11,967,934 B2
(45) Date of Patent: Apr. 23, 2024

(54) POWER AMPLIFIER CIRCUIT

(71) Applicant: SUMITOMO ELECTRIC INDUSTRIES, LTD., Osaka (JP)

(72) Inventor: Takeshi Kawasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 425 days.

(21) Appl. No.: 17/319,879

(22) Filed: May 13, 2021

(65) Prior Publication Data

US 2021/0367559 A1 Nov. 25, 2021

(30) Foreign Application Priority Data

May 20, 2020 (JP) .................................. 2020-087945

(51) Int. Cl.
| | | |
|---|---|---|
| *H03F 3/68* | (2006.01) | |
| *H03F 1/02* | (2006.01) | |
| *H03F 1/22* | (2006.01) | |
| *H03F 3/21* | (2006.01) | |

(52) U.S. Cl.
CPC ........... *H03F 1/0288* (2013.01); *H03F 3/211* (2013.01); *H03F 2203/21131* (2013.01)

(58) Field of Classification Search
CPC .................. H03F 1/0288; H03F 3/211; H03F 2203/21131; H03F 2200/451; H03F 3/21; H03F 3/602; H03F 3/195; H03F 3/607; H03F 3/60; H03F 1/223; H03F 1/22; H03F 2200/294
USPC .............................. 330/124 R, 286, 295, 311
See application file for complete search history.

(56) References Cited

U.S. PATENT DOCUMENTS

| | | | | |
|---|---|---|---|---|
| 6,556,085 B2* | 4/2003 | Kwon | ..................... | H03F 3/193 330/285 |
| 7,855,605 B1* | 12/2010 | Chang | ..................... | H03F 3/191 330/306 |
| 7,876,158 B2* | 1/2011 | Chow | ..................... | H03F 3/195 330/288 |
| 8,339,205 B1* | 12/2012 | Voo | ......................... | H03F 1/223 330/311 |
| 2006/0103468 A1* | 5/2006 | Su | ............................ | H03F 1/22 330/301 |

(Continued)

FOREIGN PATENT DOCUMENTS

JP 2011-151694 8/2011

*Primary Examiner* — Khanh V Nguyen
(74) *Attorney, Agent, or Firm* — SMITH, GAMBRELL & RUSSELL, LLP.

(57) ABSTRACT

A power amplifier circuit is a Doherty type. A peak amplifier has a first transistor and a second transistor. A first source terminal is connected to a first constant potential line. A first drain terminal and a second source terminal are connected to a first node. A second drain terminal is connected to a second constant potential line having a higher potential than the first constant potential line. A first control terminal is connected to a first bias voltage application circuit, and an input signal is input to the first control terminal via a first alternating current coupling circuit. A second control terminal is connected to a second bias voltage application circuit and is connected to the first node via a second alternating current coupling circuit. The first node is connected to the first constant potential line via a third alternating current coupling circuit.

12 Claims, 17 Drawing Sheets

(56) References Cited

U.S. PATENT DOCUMENTS

| | | | |
|---|---|---|---|
| 2009/0085664 A1* | 4/2009 | Yang | H03F 1/0261 330/277 |
| 2011/0181363 A1 | 7/2011 | Anegawa et al. | |
| 2018/0026594 A1* | 1/2018 | Lehtola | H03F 3/211 455/571 |
| 2019/0149099 A1* | 5/2019 | Lehtola | H03F 1/0266 330/124 R |
| 2019/0165738 A1* | 5/2019 | Pan | H03F 1/0288 |

\* cited by examiner

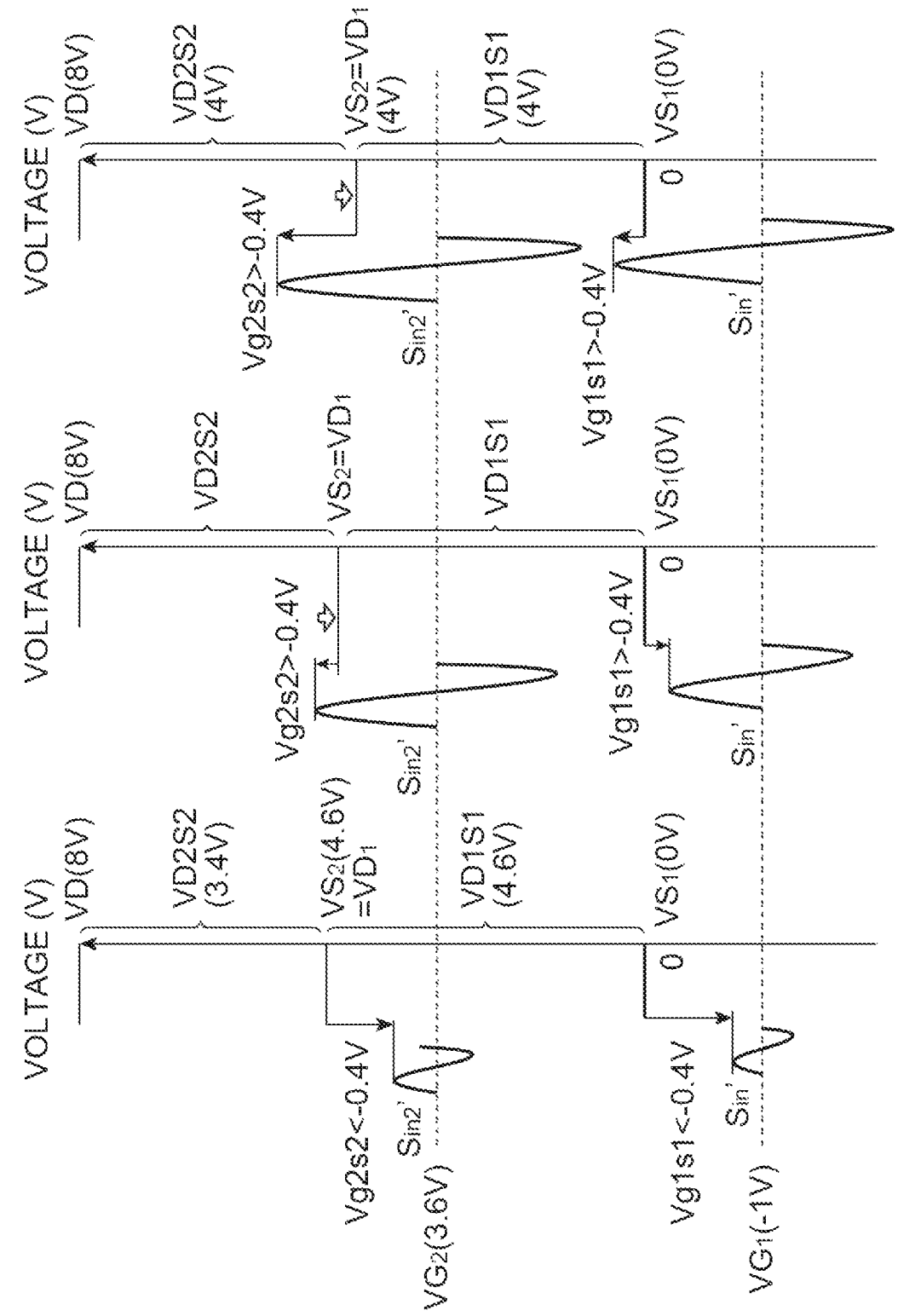

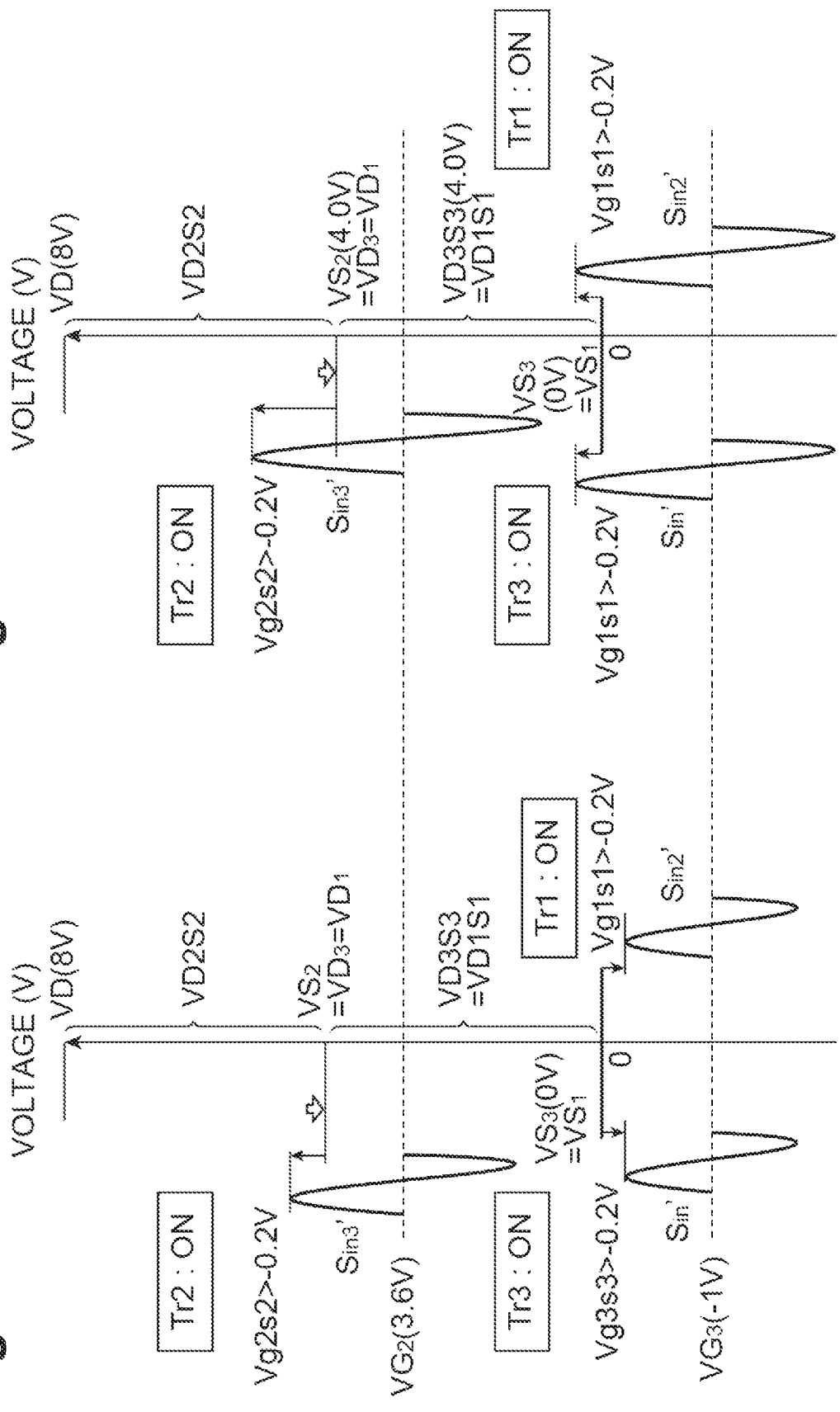

POWER AMPLIFIER CIRCUIT

CROSS-REFERENCE TO RELATED APPLICATIONS

This application is based upon and claims the benefit of priority from Japanese Patent Application No. 2020-087945, filed on May 20, 2020, the entire contents of which are incorporated herein by reference.

TECHNICAL FIELD

The present disclosure relates to a power amplifier circuit.

BACKGROUND

JP2011-151694A discloses a technique relating to a power amplifier circuit.

SUMMARY

The present disclosure provides a power amplifier circuit. The power amplifier circuit is a Doherty type power amplifier circuit and includes a main amplifier and a peak amplifier. A first input signal and a second input signal branched off from one input signal are respectively input to the main amplifier and the peak amplifier. The power amplifier circuit synthesizes and outputs a first output signal from the main amplifier and a second output signal from the peak amplifier. The peak amplifier includes a first transistor and a second transistor. The first transistor includes a first source terminal, a first drain terminal and a first control terminal. The second transistor includes a second source terminal, a second drain terminal and a second control terminal. The first source terminal is connected to a first constant potential line. The first drain terminal is connected to a first node. The second source terminal is connected to the first node. The second drain terminal is connected to a second constant potential line having a higher potential than the first constant potential line. The first control terminal is connected to a first bias voltage application circuit. A second input signal is input to the first control terminal via a first alternating current coupling circuit. The first bias voltage application circuit applies a first bias voltage to the first control terminal. The second control terminal is connected to a second bias voltage application circuit and is connected to the first node via a second alternating current coupling circuit. The first node is connected to the first constant potential line via a third alternating current coupling circuit. The second bias voltage application circuit applies a second bias voltage to the second control terminal. A second node between the second drain terminal and the second constant potential line is connected to a fourth alternating current coupling circuit, and outputs a second output signal via the fourth alternating current coupling circuit.

BRIEF DESCRIPTION OF THE DRAWINGS

FIGS. 3A, 3B and 3C are diagrams for explaining a specific example of an operation of the peak amplifier.

FIGS. 10A and 10B are diagrams for explaining a specific example of the operation of the peak amplifier.

DETAILED DESCRIPTION

Figure 1:
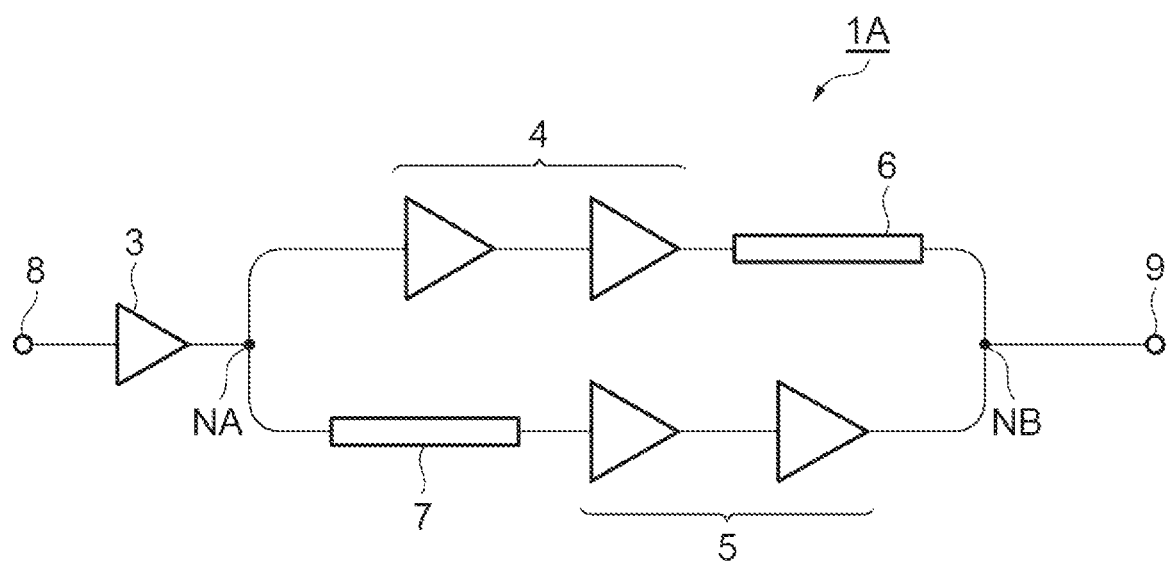
FIG. 1 is a diagram schematically showing a configuration of a power amplifier circuit according to a first embodiment.

Problems to be Solved by the Present Disclosure

For example, in a power amplifier circuit such as a microwave amplifier circuit, a so-called Doherty type configuration may be used to improve power efficiency. The Doherty type power amplifier circuit includes a main amplifier which performs class A to class AB or class B operations and a peak amplifier which performs a class C operation, and individually amplifies an input signal in the main amplifier and the peak amplifier, and synthesizes and outputs an output signal from the main amplifier and an output signal from the peak amplifier. In the Doherty type power amplifier circuit, an impedance of the peak amplifier decreases as output power increases, and as a result, a load on the main amplifier is reduced, and amplification can be performed with high power efficiency.

In such a Doherty type power amplifier circuit, when gains of transistors constituting the main amplifier and the peak amplifier are smaller than a gain required for the power amplifier circuit, it is necessary to configure a plurality of transistors in multiple stages. In that case, in the peak amplifier, it is desirable that timings at which the plurality of transistors connected in multiple stages are turned into an ON state (in other words, the plurality of transistors are turned on) are close to each other.

Effects of the Present Disclosure

According to the present disclosure, in the peak amplifier of the Doherty type power amplifier circuit, the timings at which the plurality of transistors connected in multiple stages are turned into the ON state can be brought close to each other.

EXPLANATION OF EMBODIMENTS OF THE PRESENT DISCLOSURE

First, embodiments of the present disclosure will be listed and described. The power amplifier circuit according to one embodiment is a Doherty type power amplifier circuit and includes a main amplifier and a peak amplifier. A first input signal and a second input signal branched off from one input signal are input to the main amplifier and the peak amplifier, respectively. The power amplifier circuit synthesizes and outputs a first output signal from the main amplifier and a second output signal from the peak amplifier. The peak amplifier has a first transistor and a second transistor. The first transistor has a first source terminal, a first drain terminal, and a first control terminal. The second transistor has a second source terminal, a second drain terminal, and a second control terminal. The first source terminal is connected to a first constant potential line. The first drain terminal is connected to a first node. The second source terminal is connected to the first node. The second drain terminal is connected to a second constant potential line having a higher potential than the first constant potential line. The first control terminal is connected to a first bias voltage application circuit. The second input signal is input to the first control terminal via a first alternating current coupling circuit. The first bias voltage application circuit applies a first bias voltage to the first control terminal. The second control terminal is connected to a second bias voltage application circuit and is connected to the first node via a second alternating current coupling circuit. The first node is connected to the first constant potential line via a third alternating current coupling circuit. The second bias voltage application circuit applies a second bias voltage to the second control terminal. A second node between the second drain terminal and the second constant potential line is connected to a fourth alternating current coupling circuit and outputs the second output signal via the fourth alternating current coupling circuit. With such a configuration, in the peak amplifier of the Doherty type power amplifier circuit, timings at which a plurality of transistors connected in multiple stages are turned into an ON state can be brought close to each other.

In the above-described power amplifier circuit, the first bias voltage may have a magnitude such that the first transistor is in a pinch-off state when power of a signal input to the first control terminal does not exceed a first level, and the first transistor is in the ON state when the power of the signal input to the first control terminal exceeds the first level.

In the above-described power amplifier circuit, the second bias voltage may have a magnitude such that the second transistor is in a pinch-off state when the power of the signal input to the first control terminal does not exceed the first level, and the second transistor is in the ON state when the power of the signal input to the first control terminal exceeds the first level.

In the above-described power amplifier circuit, the peak amplifier may further include a third transistor having a third source terminal, a third drain terminal, and a third control terminal. The third source terminal may be connected to the first constant potential line. The third drain terminal may be connected to the first node. The third control terminal may be connected to a third bias voltage application circuit configured to apply a third bias voltage to the third control terminal. The second input signal may be input to the third control terminal via a fifth alternating current coupling circuit. The first control terminal may be connected to the third drain terminal via the first alternating current coupling circuit. The second input signal may be amplified by the third transistor and is then input to the first control terminal via the first alternating current coupling circuit.

In the above-described power amplifier circuit, a total gate width of the second transistor may be equal to or greater than a sum of a total gate width of the first transistor and a total gate width of the third transistor.

In the above-described power amplifier circuit, the third bias voltage may have a magnitude such that the third transistor is in the pinch-off state when the power of a signal input to the third control terminal does not exceed a first level, and the third transistor is in the ON state when the power of the signal input to the third control terminal exceeds the first level.

In the above-described power amplifier circuit, the first bias voltage may have a magnitude such that the first transistor is in the pinch-off state when power of a signal input to the first control terminal does not exceed a second level, and the first transistor is in an ON state when the power of the signal input to the first control terminal exceeds the second level. The second level may be greater than the first level.

In the above-described power amplifier circuit, the main amplifier may have the same configuration as the peak amplifier except for a magnitude of each of the bias voltages.

DETAILS OF EMBODIMENTS OF THE PRESENT DISCLOSURE

Specific examples of a power amplifier circuit according to an embodiment of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted. In the description below, "connected" means "being electrically connected". Unless otherwise specified, the electrical connection includes a connection via conductive wires with substantially zero electrical resistance, as well as a connection via electronic components such as resistors.

First Embodiment

FIG. 1 is a diagram schematically showing a configuration of a power amplifier circuit 1A according to a first embodiment of the present disclosure. This power amplifier circuit 1A is a so-called Doherty type microwave amplifier circuit. As shown in the drawing, the power amplifier circuit 1A includes a driver amplifier 3, a main amplifier 4, a peak amplifier 5, and λ/4 lines 6 and 7.

An input terminal of the driver amplifier 3 is connected to a signal input terminal 8 of the power amplifier circuit 1A. The driver amplifier 3 inputs a signal to be amplified from a signal input terminal 8, amplifies the signal, and outputs the amplified signal. The driver amplifier 3 is configured to include, for example, a transistor. A frequency of the signal input from the signal input terminal 8 is, for example, 60 GHz or more and 90 GHz or less. An output terminal of the driver amplifier 3 is connected to a node NA.

The main amplifier 4 and the peak amplifier 5 individually amplify the input signal. In the present embodiment, each of the main amplifier 4 and the peak amplifier 5 is configured as a two-stage amplifier. An input terminal of the main amplifier 4 is connected to the output terminal of the driver amplifier 3 via the node NA. The input terminal of the main amplifier 4 receives a first input signal which is one of signals branched off at the node NA after being amplified by the driver amplifier 3. The main amplifier 4 performs class A to class AB or class B amplification operations. An output terminal of the main amplifier 4 is connected to a signal output terminal 9 of the power amplifier circuit 1A via a node NB. The λ/4 line 6 is interposed between the output terminal of the main amplifier 4 and the node NB. The amplified signal output from the main amplifier 4 reaches the node NB through the λ/4 line 6. On the other hand, an input terminal of the peak amplifier 5 is connected to the output terminal of the driver amplifier 3 via the node NA. The λ/4 line 7 is interposed between the node NA and the input terminal of the peak amplifier 5. The input terminal of the peak amplifier 5 receives a second input signal which is the other signal branched off at the node NA after being amplified by the driver amplifier 3 via the λ/4 line 7. The peak amplifier 5 performs a class C amplification operation. An output terminal of the peak amplifier 5 is connected to the signal output terminal 9 of the power amplifier circuit 1A via the node NB. The amplified signal output from the peak amplifier 5 reaches the node NB. The output signal from the main amplifier 4 and the output signal from the peak amplifier 5 are synthesized with each other at the node NB and are output from the signal output terminal 9 to the outside of the power amplifier circuit 1A.

Figure 2:
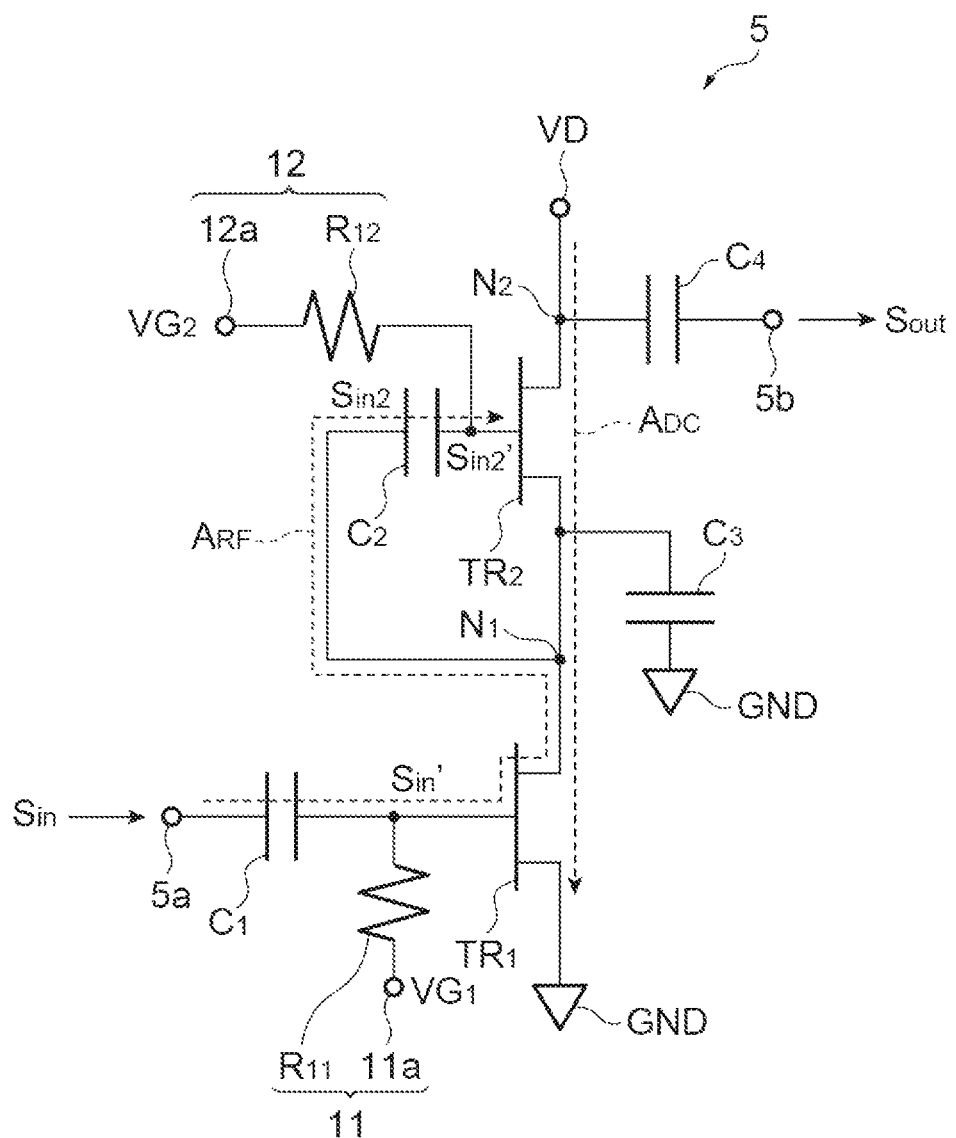
FIG. 2 is a circuit diagram showing a detailed configuration of a peak amplifier.

FIG. 2 is a circuit diagram showing a detailed configuration of the peak amplifier 5. The peak amplifier 5 of the present embodiment has a so-called current-reuse configuration. The current reuse configuration refers to a configuration in which power supplied to a rear-stage circuit is also supplied to a front-stage circuit via the rear-stage circuit in a plurality of stages of electronic circuits. As shown in the drawing, the peak amplifier 5 has a first transistor $TR_1$ as a first stage amplifier circuit and a second transistor $TR_2$ as a final stage amplifier circuit. The first transistor $TR_1$ is connected in series between a ground potential line GND which is a first constant potential line and a first node $N_1$. The second transistor $TR_2$ is connected in series between the first node $N_1$ and a power supply potential line VD which is a second constant potential line having a potential higher than the ground potential line GND. In other words, one current terminal of the first transistor $TR_1$, for example, a source is connected to the ground potential line GND, and the other current terminal, for example, a drain is connected to the first node $N_1$. One current terminal of the second transistor $TR_2$, for example, a source is connected to the first node $N_1$, and the other current terminal, for example, a drain is connected to the power supply potential line VD. An electrical connection between the first transistor $TR_1$ and the ground potential line GND, an electrical connection between the first transistor $TR_1$ and the first node $N_1$, an electrical connection between the second transistor $TR_2$ and the first node $N_1$ and an electrical connection between the second transistor $TR_2$ and the power supply potential line VD are performed with a resistance value of substantially zero without using a resistor or the like. The first transistor $TR_1$ and the second transistor $TR_2$ are, for example, GaN high electron mobility transistors (GaN-HEMTs).

A control terminal, that is, a gate of the first transistor $TR_1$ is connected to an input terminal 5a of the peak amplifier 5 via a coupling capacitor $C_1$ as a first alternating current coupling circuit in an alternating current manner and is isolated from the input terminal 5a in a direct current manner. The control terminal of the first transistor $TR_1$ receives an input signal $S_{in}$ from the input terminal 5a via the coupling capacitor $C_1$. The input signal $S_{in}$ is a second input signal branched off at the node NA in FIG. 1. The control terminal of the first transistor $TR_1$ is connected to a circuit 11 which applies a first bias voltage $VG_1$ to the control terminal. An input signal $S_{in}'$ is input to the control terminal of the first transistor $TR_1$. In the input signal $S_{in}'$, the first bias voltage $VG_1$ is applied to a high frequency signal component of the input signal $S_{in}$ propagating through the coupling capacitor $C_1$. In the present embodiment, the circuit 11 includes a first voltage input terminal 11a and a resistor $R_{11}$. The first voltage input terminal 11a is connected to the control terminal of the first transistor $TR_1$ via the resistor Rn. For the class C operation of the first transistor $TR_1$, the first bias voltage $VG_1$ is set to such a magnitude that the first transistor $TR_1$ is in a pinch-off state when the power of the input signal $S_{in}$ (exactly, an input signal $S_{in}'$) does not exceed a first level, and the first transistor $TR_1$ is in an ON state when the power of the input signal $S_{in}$ (exactly, the input signal $S_{in}'$) exceeds the first level. In one embodiment, the first level at which the first transistor $TR_1$ is turned into the ON state is −0.4 V, and the first bias voltage $VG_1$ at which the first transistor $TR_1$ is turned into the pinch-off state when the power of the input signal $S_{in}$ does not exceed the first level is −1 V. The first level is determined based on a level at which the main amplifier 4 is saturated.

A control terminal, that is, a gate of the second transistor $TR_2$ is connected to the first node $N_1$ via a coupling capacitor $C_2$ as a second alternating current coupling circuit in an alternating current manner and is isolated from the first node $N_1$ in a direct current manner. The input signal $S_{in}'$ is propagated as an input signal $S_{in2}$ to the first node $N_1$ via the first transistor $TR_1$. The control terminal of the second transistor $TR_2$ is connected to a circuit 12 which applies a second bias voltage $VG_2$ to the control terminal. An input signal $S_{in2}'$ is input to the control terminal of the second transistor $TR_2$. In the input signal $S_{in2}'$, the second bias voltage $VG_2$ is applied to a high frequency signal component of the input signal $S_{in2}$ propagating through the coupling capacitor $C_2$. In the present embodiment, the circuit 12 includes a voltage input terminal 12a and a resistor $R_{12}$. The voltage input terminal 12a is connected to the control terminal of the second transistor $TR_2$ via the resistor $R_{12}$. The second bias voltage $VG_2$ has a magnitude such that the second transistor $TR_2$ is in the pinch-off state when the power of the input signal $S_{in2}'$ does not exceed the first level, and the second transistor $TR_2$ is in the ON state when the power of the input signal $S_{in2}'$ exceeds the first level. In one embodiment, the second bias voltage $VG_2$ is 3.6 V.

The first node $N_1$ is connected to the ground potential line GND via a coupling capacitor $C_3$ as a third alternating current coupling circuit in an alternating current manner and is isolated from the ground potential line GND in a direct current manner. The second node $N_2$ between the second transistor $TR_2$ and the power supply potential line VD is connected to an output terminal $5b$ of the peak amplifier 5 via a coupling capacitor $C_4$ as a fourth alternating current coupling circuit in an alternating current manner and is isolated from the output terminal $5b$ in a direct current manner. The peak amplifier 5 outputs an amplified output signal $S_{out}$ from the second node $N_2$ via the coupling capacitor $C_4$.

An operation of the peak amplifier 5 having the above-described configuration will be described. When the input signal $S_{in}$ is received at the input terminal $5a$, the input signal $S_{in}$ which is a high frequency signal passes through the coupling capacitor $C_1$ and reaches the control terminal of the first transistor $TR_1$. The first bias voltage $VG_1$ is applied from the circuit 11 to the control terminal of the first transistor $TR_1$. Therefore, a voltage obtained by synthesizing the first bias voltage $VG_1$ with the input signal $S_{in}$ is applied to the control terminal of the first transistor $TR_1$ as the input signal $S_{in}'$. When the first bias voltage $VG_1$ is set to an appropriate magnitude, and the power of the input signal $S_{in}'$ does not exceed the first level, the first transistor $TR_1$ is in the pinch-off state, and only a small amount of current flows between current terminals of the first transistor $TR_1$. When the power of the input signal $S_{in}'$ exceeds the first level, the first transistor $TR_1$ is in the ON state, and a current corresponding to a magnitude of the input signal $S_{in}'$ flows between the current terminals of the first transistor $TR_1$.

Further, the high frequency component of the voltage applied to the control terminal of the first transistor $TR_1$ caused by the input signal $S_{in}'$ is amplified and is then input as the input signal $S_{in2}$ from the first node $N_1$ to the control terminal of the second transistor $TR_2$ through the coupling capacitor $C_2$. An arrow $A_{RF}$ in FIG. 2 shows a flow of such a high frequency component. The second bias voltage $VG_2$ is applied from the circuit 12 to the control terminal of the second transistor $TR_2$. Therefore, a voltage obtained by synthesizing the second bias voltage $VG_2$ with the high frequency component in which the input signal $S_{in}$ is amplified is applied as the input signal $S_{in2}'$ to the control terminal of the second transistor $TR_2$. When the second bias voltage $VG_2$ is set to an appropriate magnitude, and the power of the input signal $S_{in}'$ does not exceed the first level, the second transistor $TR_2$ is in the pinch-off state, and only a small amount of current flows between current terminals of the second transistor $TR_2$. When the power of the input signal $S_{in}'$ exceeds the first level, the second transistor $TR_2$ is in the ON state, and a current corresponding to the magnitude of the amplified high frequency component flows between the current terminals of the second transistor $TR_2$.

Since the first transistor $TR_1$ and the second transistor $TR_2$ are connected in series between the power supply potential line VD and the ground potential line GND, the current flowing therethrough is common. An arrow $A_{DC}$ in FIG. 2 shows a flow of such a common current. The potential of the second node $N_2$ generated by this current includes a high frequency component obtained by amplifying the input signal $S_{in}$ in two stages. This high frequency component passes through the coupling capacitor $C_4$ and is output as the output signal $S_{out}$ from the output terminal $5b$ to the outside of the peak amplifier 5, that is, to the node NB shown in FIG. 1. A magnitude of the common current flowing through the first transistor $TR_1$ and the second transistor $TR_2$ is mainly determined by a magnitude of the first bias voltage $VG_1$.

The main amplifier 4 shown in FIG. 1 may have the same configuration as the above-described peak amplifier 5, or may have a configuration different from the peak amplifier 5. When the main amplifier 4 has the same configuration as the peak amplifier 5, since the main amplifier 4 performs the class A to class AB or class B operations, the magnitude of the first bias voltage $VG_1$ is different from that in the peak amplifier 5. That is, in order to cause the first transistor $TR_1$ to perform the class A to class AB or class B operations, the first bias voltage $VG_1$ has a magnitude such that the first transistor $TR_1$ is always in the ON state regardless of the power of the input signal $S_{in}$. In one embodiment, the first bias voltage $VG_1$ is −1.0 V.

FIGS. 3A, 3B and 3C are diagrams for explaining a specific example of the operation of the peak amplifier 5. In these drawings, a vertical axis indicating a magnitude of a voltage also shows levels of the first bias voltage $VG_1$, a source voltage $VS_1$ of the first transistor $TR_1$, the second bias voltage $VG_2$, a source voltage $VS_2$ of the second transistor $TR_2$, and the power supply potential line VD. Among these voltages, the first bias voltage $VG_1$, the source voltage $VS_1$ of the first transistor $TR_1$, the second bias voltage $VG_2$, and the power supply potential line VD are fixed bias voltages. The source voltage $VS_1$ is, for example, 0 V. The source voltage $VS_2$ of the second transistor $TR_2$ is the same as a drain voltage $VD_1$ of the first transistor $TR_1$. The source voltage $VS_2$ varies according to operation states of the first transistor $TR_1$ and the second transistor $TR_2$.

FIG. 3A shows a case in which the power of the input signal $S_{in}$ to the peak amplifier 5 is low. FIG. 3B shows a case in which the power of the input signal $S_{in}$ to the peak amplifier 5 starts to increase and the peak amplifier 5 is shifted from an OFF state to an ON state. FIG. 3C shows a case in which the power of the input signal $S_{in}$ to the peak amplifier 5 increases and the peak amplifier 5 is in the ON state.

FIGS. 3A, 3B, and 3C also show an image of a voltage level of an input waveform of the input signal $S_{in}'$ at the control terminal, that is, the gate of the first transistor $TR_1$ and the input signal $S_{in2}'$ at the control terminal, that is, the gate of the second transistor $TR_2$. As a result, a level of a voltage $Vg1s1$ applied between the gate and the source of the first transistor $TR_1$ and a level of a voltage $Vg2s2$ applied between the gate and the source of the second transistor $TR_2$ are shown with arrows.

When the power of the input signal $S_{in}$ to the peak amplifier 5 is low (see FIG. 3A), the power of each of the input signal $S_{in}'$ and the input signal $S_{in2}'$ is also low. Since the first bias voltage $VG_1$ and the second bias voltage $VG_2$ are set so that the first transistor $TR_1$ and the second transistor $TR_2$ are in the pinch-off state, and the voltage $Vg1s1$ between the gate and the source of the first transistor $TR_1$ and the voltage $Vg2s2$ between the gate and the source of the second transistor $TR_2$ do not exceed a predetermined level (here, −0.4 V is assumed), the current of the transistors flows only slightly.

On the other hand, due to the circuit configuration, a drain current $ID_1$ of the first transistor $TR_1$ becomes equal to a drain current $ID_2$ of the second transistor $TR_2$. Thus, the potential of the drain voltage $VD_1$ of the first transistor $TR_1$ which is also the potential of the source voltage $VS_2$ of the second transistor $TR_2$ is determined with respect to the voltage $Vg1s1$ between the gate and the source of the first transistor $TR_1$ so that the drain current $ID_1$ and the drain current $ID_2$ become equal to each other. Subsequently, the voltage VD1S1 between the drain and the source of the first transistor $TR_1$, the voltage Vg2s2 between the gate and the source of the second transistor $TR_2$, and the voltage VD2S2 between the drain and the source of the second transistor $TR_2$ are determined. Actually, the voltage VD1S1 between the drain and the source of the first transistor $TR_1$ is different from the voltage VD2S2 between the drain and the source of the second transistor $TR_2$, and there is a slight difference therebetween, that is, VG1S1<VG2S2.

After that, when the power of the input signal $S_{in}$ to the peak amplifier 5 starts to increase, the power of each of the input signal $S_{in1}$' and the input signal $S_{in2}$' also starts to increase. Then, when the voltage Vg1s1 between the gate and the source of the first transistor $TR_1$ and the voltage Vg2s2 between the gate and the source of the second transistor $TR_2$ exceed a predetermined level (−0.4 V), as shown in FIG. 3B, the first transistor $TR_1$ is turned into the ON state, and the drain current $ID_1$ of the first transistor $TR_1$ starts to flow. Also in this case, the potential of the source voltage $VS_2$ which is also the potential at the drain voltage $VD_1$ is determined so that $ID_1=ID_2$ is satisfied, and then, the voltage VD1S1 between the drain and the source of the first transistor $TR_1$, the voltage VD2S2 between the drain and the source of the second transistor $TR_2$, and the voltage Vg2s2 between the gate and the source of the second transistor $TR_2$ are subsequently determined. However, when the drain current $ID_2$ flows, the potential of the source voltage $VS_2$ which is also the potential of the drain voltage $VD_1$ is lowered to satisfy $ID_1=ID_2$.

Then, as shown in FIG. 3C, when the power of the input signal $S_{in}$ to the peak amplifier 5 is further increased, the power of each of the input signal $S_{in1}$' and the input signal $S_{in2}$' is also further increased. The drain current $ID_1$ of the first transistor $TR_1$ further flows, and the potential of the source voltage $VS_2$ which is also the potential of the drain voltage $VD_1$ is determined so that $ID_1=ID_2$ is satisfied, and then, the voltage VD1S1 between the drain and the source of the first transistor $TR_1$, the voltage VD2S2 between the drain and the source of the second transistor $TR_2$, and the voltage Vg2s2 between the gate and the source of the second transistor $TR_2$ are subsequently determined. However, when the drain current $ID_2$ flows, the potential of the source voltage $VS_2$ which is also the potential of the drain voltage $VD_1$ is further lowered to satisfy $ID_1=ID_2$. The operation at this time is the same as the operation of the main amplifier 4 when the main amplifier 4 has the same configuration as the peak amplifier 5.

Figure 4A:
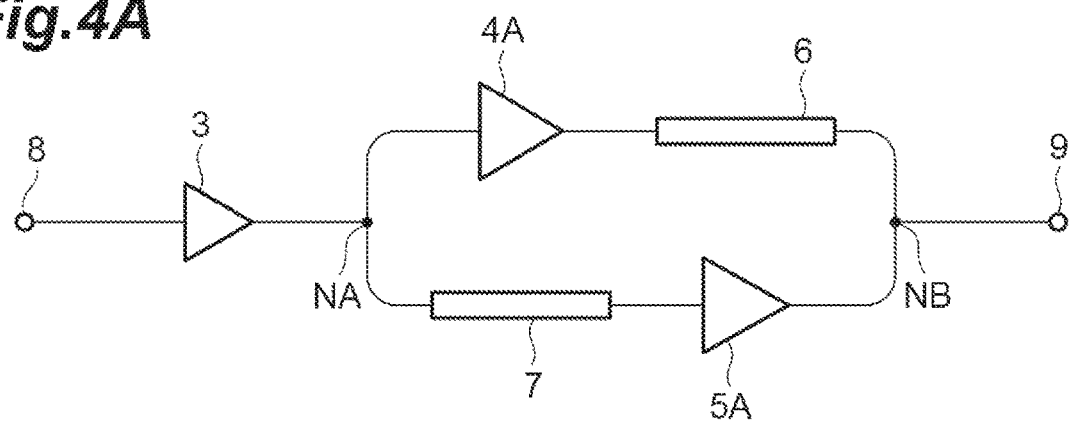
FIG. 4A is a diagram showing a configuration of a general Doherty type power amplifier circuit.

Effects obtained by the power amplifier circuit 1A of the present embodiment described above will be described together with the conventional problems. FIG. 4A is a diagram showing a configuration of a general Doherty type power amplifier circuit. As shown in the drawing, the general Doherty type power amplifier circuit includes a main amplifier 4A of a single-stage amplifier which performs the class A to class AB or class B operations, and a peak amplifier 5A of a single-stage amplifier which performs the class C operation. This circuit individually amplifies an input signal in the main amplifier 4A and the peak amplifier 5A, and synthesizes and outputs the output signal from the main amplifier 4A and the output signal from the peak amplifier 5A. In the Doherty type power amplifier circuit, an impedance of the peak amplifier 5A decreases as the output power increases, and as a result, a load on the main amplifier 4A is reduced, and amplification can be performed with high power efficiency.

Figure 4B:
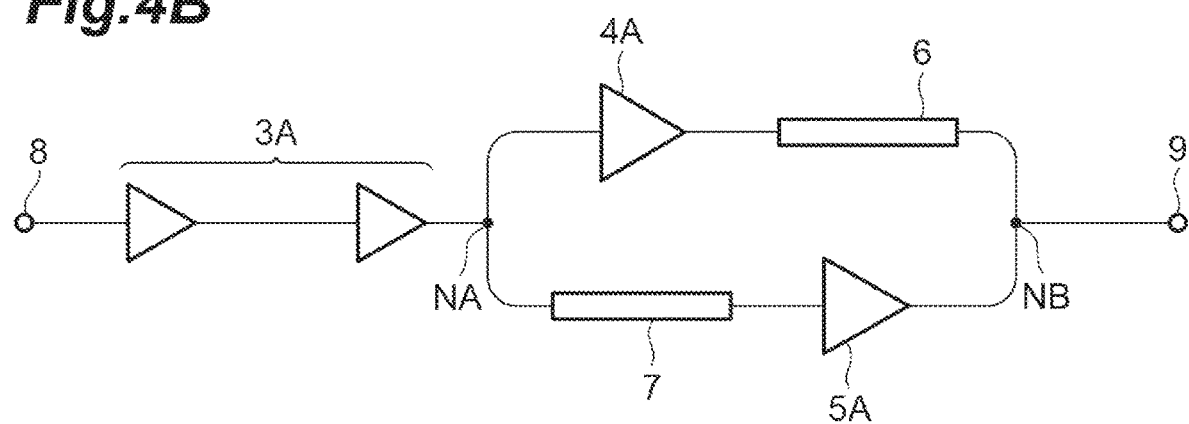
FIG. 4B is a diagram showing a configuration in which a driver amplifier configured of a plurality of stages of amplifiers is provided at a stage in front of a node.

In such a Doherty type power amplifier circuit, when a gain of the amplifier is a small value such as less than 10 dB, for example, as shown in FIG. 4B, it is conceivable to provide a driver amplifier 3A configured of a plurality of stages of amplifiers at a stage in front of the node NA. However, even when only the last one stage has the Doherty structure as in this example, contribution to the power efficiency of the entire power amplifier circuit is small. As a frequency of the input signal becomes higher, the gain of the amplifier becomes smaller, and thus such a problem becomes significant.

Figure 5A:
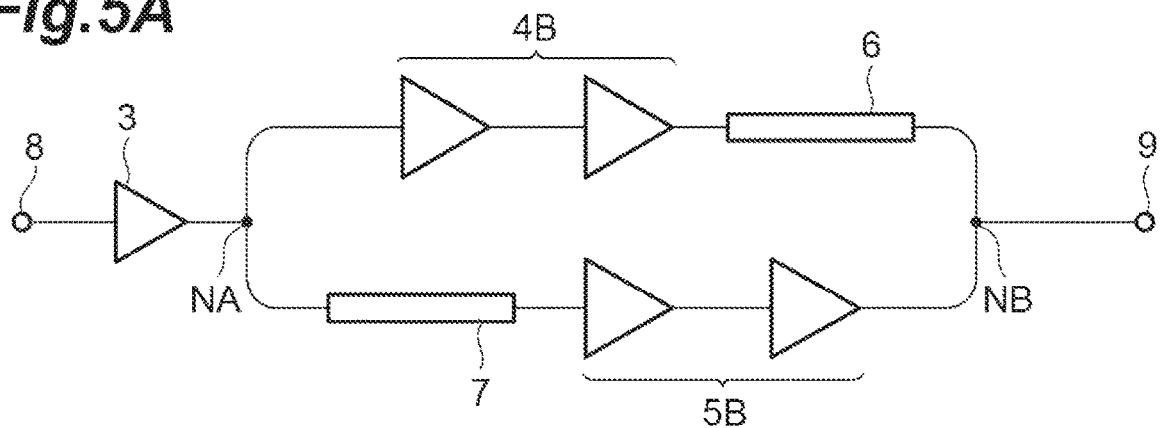
FIG. 5A is a diagram showing an example in which a Doherty structure is configured of a main amplifier and a peak amplifier each of which is configured of a plurality of stages of amplifiers.
Figure 5B:
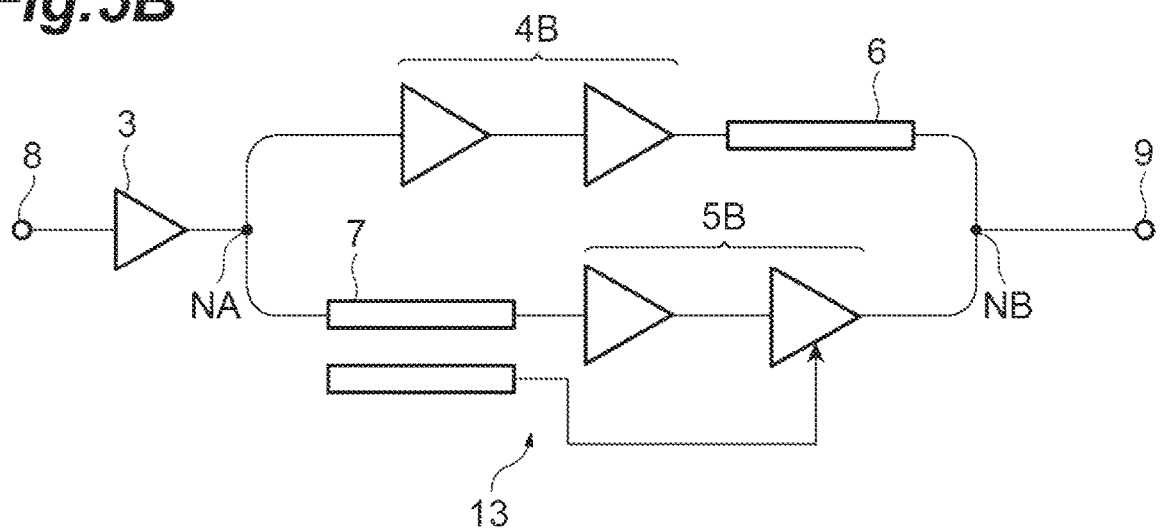
FIG. 5B is a diagram showing an example in which a circuit for monitoring input signal power to the peak amplifier and controlling a gate bias according to the input signal power is provided.

Therefore, as shown in FIG. 5A, it is conceivable to form a Doherty structure by a main amplifier 4B and a peak amplifier 5B each of which is configured of a plurality of stages of amplifiers. However, in this case, it is necessary that the plurality of stages of amplifiers in the peak amplifier 5B which performs the class C operation start up (the plurality of stages of amplifiers are turned into the ON state) almost at the same time. Therefore, in a case of a configuration in which a certain amplifier starts up and then an amplifier in the subsequent stage starts up based on an output of the amplifier, it is necessary to set a gate bias of a transistor constituting the amplifier in each of the stages to be relatively shallow. Therefore, an influence of a variation in temperature characteristics of the transistor in each of the stages and a variation in a process becomes remarkable. In addition, since a leakage current becomes large, a problem that the power efficiency is lowered occurs. In order to avoid such a problem, it is conceivable to control the gate bias of the transistor constituting the amplifier in the subsequent stage independently of that at the stage in front. However, in that case, as shown in FIG. 5B, a circuit 13 for monitoring the power of the input signal to the peak amplifier 5B and controlling the gate bias according to the power of the input signal is required, and thus the power amplifier circuit is complicated. In addition, an upper limit of the input frequency to the power amplifier circuit is limited by an operation speed of the circuit 13.

Regarding the above-described problem, in the peak amplifier 5 of the present embodiment, a current reuse configuration in which the two-stage transistors $TR_1$ and $TR_2$ are connected in series with each other is configured. Further, a high frequency signal path indicated by the arrow $A_{IF}$ in FIG. 2 is separated from a direct current signal path indicated by the arrow $A_{DC}$ in FIG. 2. Thus, since the power efficiency is improved, and the second transistor $TR_2$ is immediately linked to the input signal to the first transistor $TR_1$ without providing the circuit 13 shown in FIG. 5B, timings at which the transistors $TR_1$ and $TR_2$ are turned into the ON state can be brought close to each other. Since it is not necessary to make the gate bias of each of the transistors $TR_1$ and $TR_2$ shallow, the leakage current can be significantly reduced as compared with the configuration shown in FIG. 5A.

Figure 6:
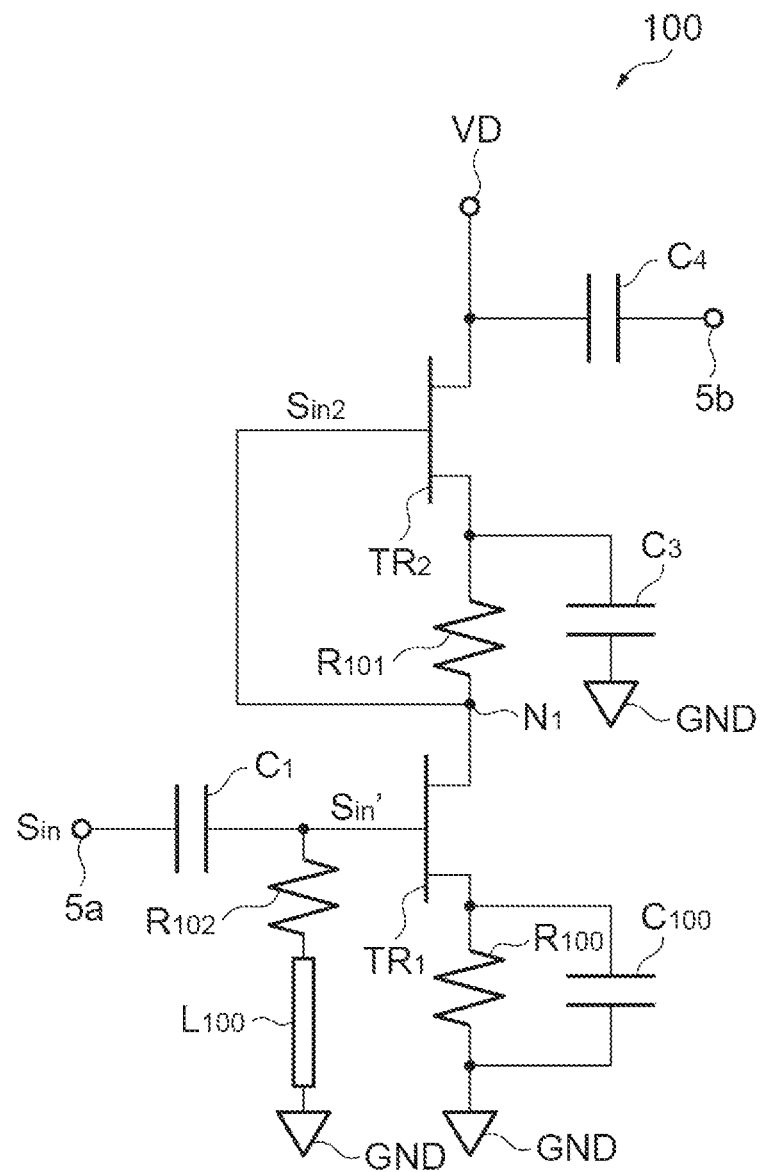
FIG. 6 is a diagram showing a power amplifier circuit having a general current-reuse structure as a comparative example.

Here, as a comparative example, a power amplifier circuit having the current reuse configuration is shown in FIG. 6. The power amplifier circuit 100 is different from the peak amplifier 5 of the present embodiment in the following points. That is, the power amplifier circuit 100 has a resistor $R_{100}$ and a capacitor $C_{100}$ connected in parallel between the first transistor $TR_1$ and the ground potential line GND. The power amplifier circuit 100 has a resistor $R_{101}$ between the second transistor $TR_2$ and the first node $N_1$. This power amplifier circuit 100 has a resistor $R_{102}$ and a distributed constant circuit $L_{100}$ connected in series between the control terminal of the first transistor $TR_1$ and the ground potential line GND, instead of the circuit 11 shown in FIG. 2. Further, the power amplifier circuit 100 does not have the coupling capacitor $C_2$ shown in FIG. 2, and the control terminal of the second transistor $TR_2$ is short-circuited to the first node $N_1$.

In the power amplifier circuit 100 shown in FIG. 6, the resistor $R_{100}$ is provided between the source terminal of the first transistor $TR_1$ and the ground potential line GND, and the resistor $R_{101}$ is provided between the source terminal of the second transistor $TR_2$ and the drain terminal of the first transistor $TR_1$. Then, the gate bias of the first transistor $TR_1$ is determined by a voltage drop of the resistor $R_{100}$, and the gate bias of the second transistor $TR_2$ is determined by a voltage drop of the resistor $R_{101}$. In the power amplifier circuit 100, with respect to the input signal $S_{in}$, it is possible to set the gate biases having the same voltage level for the input signals $S_{in}'$ and $S_{in2}$ to the gates of the transistors $TR_1$ and $TR_2$ by adopting such a self-bias configuration.

However, in order to realize the class C operation with such a self-bias configuration, it may be necessary to design the bias so that the transistor $TR_1$ is in the OFF state when the level of the input signal $S_{in}$ is low. Therefore, the bias should be designed as if the potential level of not only the input signal $S_{in}'$ to the gate of the first transistor $TR_1$ but also the input signal $S_{in2}$ to the gate of the second transistor $TR_2$ is sufficiently in the OFF state to the same extent. As a result, when the level of the input signal $S_{in}$ becomes high, a delay inevitably occurs between the timing at which the first transistor $TR_1$ is turned into the ON state and the timing at which the second transistor $TR_2$ is turned into the ON state in conjunction with the first transistor $TR_1$.

On the other hand, according to the peak amplifier 5 of the present embodiment, the gate bias of the first transistor $TR_1$ and the gate bias of the second transistor $TR_2$ can be input independently by providing the coupling capacitor $C_2$. Therefore, it is possible to realize a power amplifier circuit capable of bringing the timing at which the first transistor $TR_1$ is turned into the ON state and the timing at which the second transistor $TR_2$ is turned into the ON state close to each other while the class C operation is performed. Since the main amplifier 4 of the present embodiment performs the class A to class AB or class B operation, it may have the configuration of the power amplifier circuit 100 shown in FIG. 6.

According to the present embodiment, the voltages VD1S1 and VD2S2 between the drain and the source applied to the first transistor $TR_1$ and the second transistor $TR_2$ can be arbitrarily changed to some extent. Therefore, by changing a ratio of the voltage VD1S1 between the drain and the source of the first transistor $TR_1$ to the voltage VD2S2 between the drain and the source of the second transistor $TR_2$, it is possible to change saturation power of the first transistor $TR_1$ and the second transistor $TR_2$ without changing a total gate width of the first transistor $TR_1$ and the second transistor $TR_2$.

As described above, the first bias voltage $VG_1$ may be set to such a magnitude that the first transistor $TR_1$ is sufficiently in the pinch-off state with respect to the input signal $S_{in}'$ when the power of the input signal $S_{in}$ does not exceed the first level, and the first transistor $TR_1$ is in the ON state with respect to the input signal $S_{in}'$ when the power of the input signal $S_{in}$ exceeds the first level. The class C operation of the first transistor $TR_1$ can be performed by setting the first bias voltage $VG_1$ in this way, for example.

On the other hand, the second bias voltage $VG_2$ may be set to such a magnitude that the second transistor $TR_1$ is shallowly in the pinch-off state with respect to the input signal $S_{in2}'$ when the power of the input signal $S_{in}$ does not exceed the first level, and the second transistor $TR_2$ is quickly turned into the ON state with respect to the input signal $S_{in2}'$ when the power of the input signal $S_{in}$ exceeds the first level. As a result, in the peak amplifier 5 as a whole, it is possible to realize a power amplifier circuit capable of bringing the timing at which the first transistor $TR_1$ is turned into the ON state and the timing at which the second transistor $TR_2$ is turned into the ON state close to each other while the class C operation is performed.

As described above, the main amplifier 4 may have the same configuration as the peak amplifier 5 except for the magnitudes of the first bias voltage $VG_1$ and the second bias voltage $VG_2$. In this case, it becomes possible to simplify an analysis and the like for a design, and the design can be easy.

Second Embodiment

Figure 7:
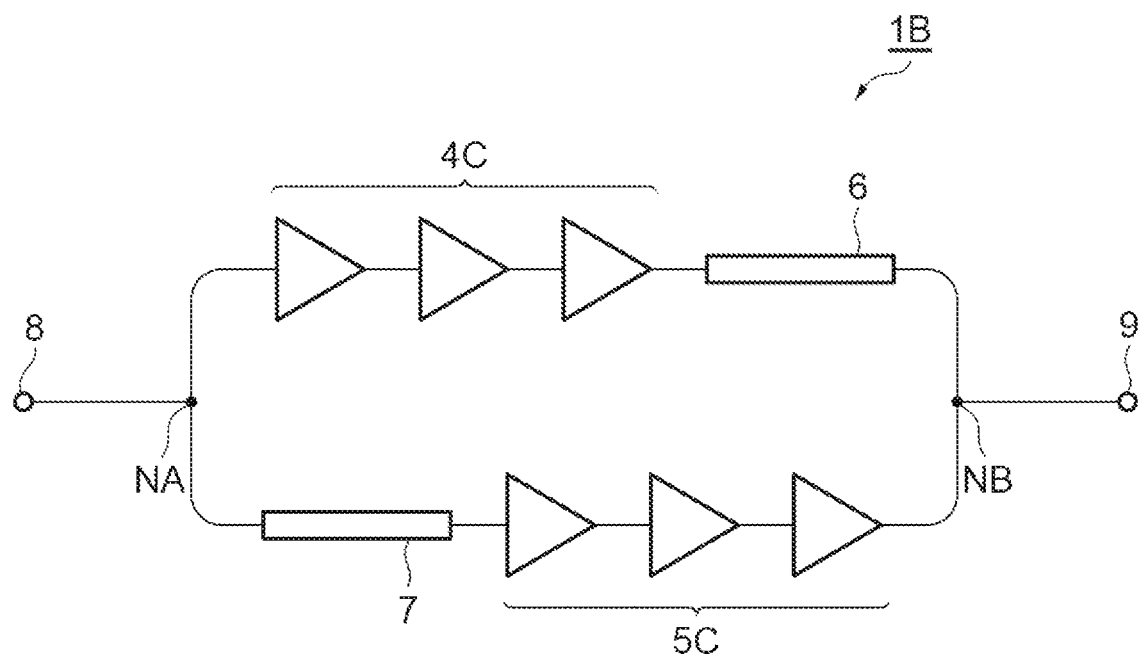
FIG. 7 is a diagram schematically showing a configuration of a power amplifier circuit according to a second embodiment.

FIG. 7 is a diagram schematically showing a configuration of a power amplifier circuit 1B according to a second embodiment of the present disclosure. The power amplifier circuit 1B and the power amplifier circuit 1A of the first embodiment are different in the configurations of the main amplifier and the peak amplifier, and are the same in other configurations. The power amplifier circuit 1B has a main amplifier 4C and a peak amplifier 5C instead of the main amplifier 4 and the peak amplifier 5 of the first embodiment. Each of the main amplifier 4C and the peak amplifier 5C is configured as a three-stage amplifier.

Figure 8:
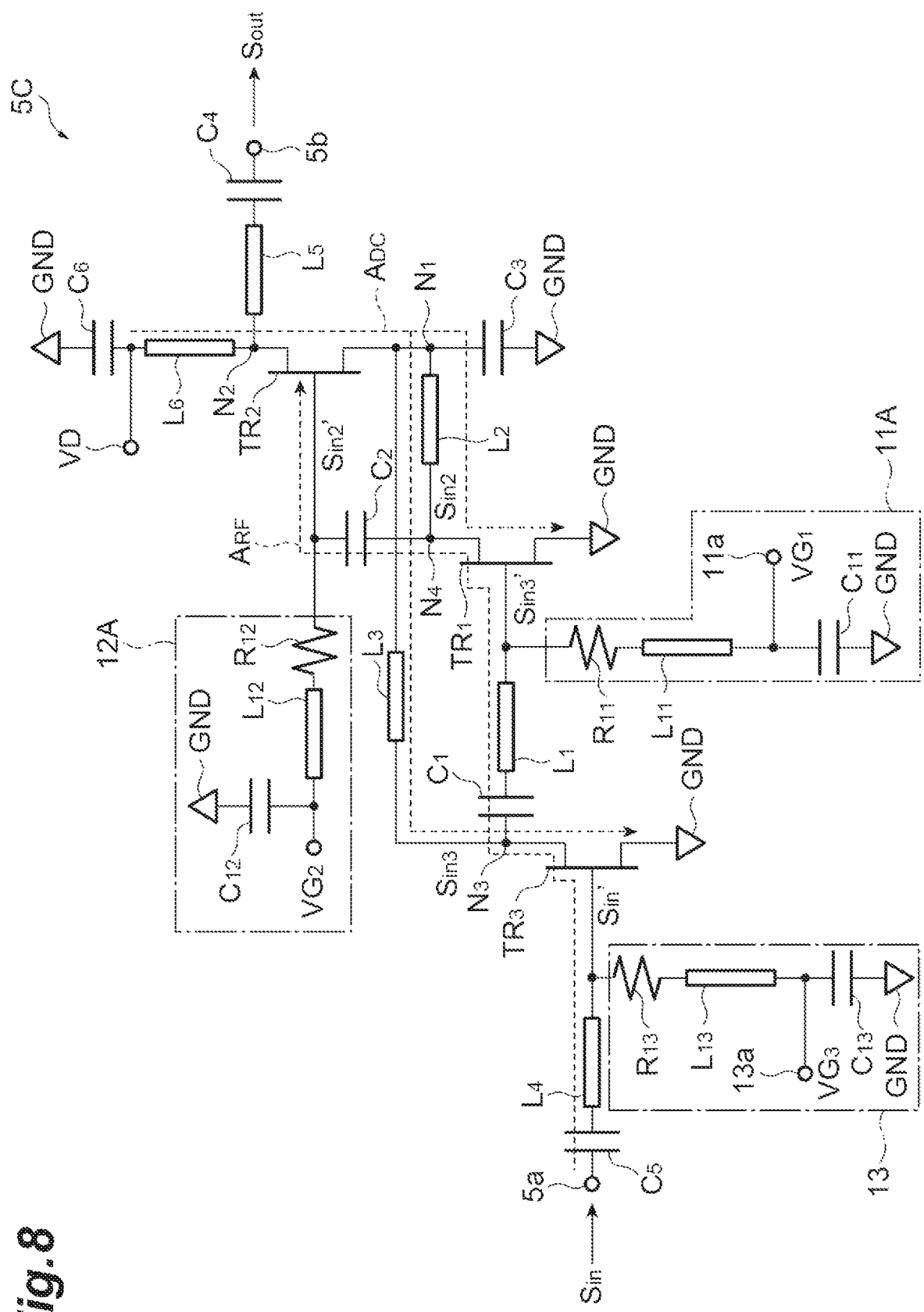
FIG. 8 is a circuit diagram showing a configuration of the peak amplifier in detail.

FIG. 8 is a circuit diagram showing the configuration of the peak amplifier 5C in detail. The peak amplifier 5C of the present embodiment also has the current reuse configuration. As shown in the drawing, the peak amplifier 5C has a transistor $TR_3$ as a first stage amplifier circuit, a transistor $TR_1$ as a second-stage amplifier circuit, and a transistor $TR_2$ as a third-stage amplifier circuit. In the present embodiment, the transistor $TR_1$ is an example of a first transistor, the transistor $TR_2$ is an example of a second transistor, and the transistor $TR_3$ is an example of a third transistor.

The transistor $TR_3$ is connected in series between the ground potential line GND and the first node $N_1$. Specifically, one current terminal of the transistor $TR_3$, for example, the source is connected to the ground potential line GND, and the other current terminal, for example, the drain is connected to the first node $N_1$ via a distributed constant circuit $L_3$. The transistor $TR_3$ is, for example, a GaN-HEMT, like the transistors $TR_1$ and $TR_2$.

The transistor $TR_1$ is connected in series between the ground potential line GND and the first node $N_1$. Specifically, one current terminal of the transistor $TR_1$, for example, the source is connected to the ground potential line GND, and the other current terminal, for example, the drain is connected to the first node $N_1$ via a distributed constant circuit $L_2$.

The transistor $TR_2$ is connected in series between the first node $N_1$ and the power supply potential line VD as in the first embodiment. Specifically, one current terminal of the transistor $TR_2$, for example, the source is connected to the first node $N_1$, and the other current terminal, for example, the drain is connected to the power supply potential line VD via a distributed constant circuit $L_6$. A total gate width $W_2$ of the transistor $TR_2$ is equal to or larger than a sum $(W_1+W_3)$ of a total gate width $W_1$ of the transistor $TR_1$ and a total gate width $W_3$ of the transistor $TR_3$. In one embodiment, the total gate width $W_2$ of the transistor $TR_2$ is equal to the sum $(W_1+W_3)$ of the total gate width $W_1$ of the transistor $TR_1$ and the total gate width $W_3$ of the transistor $TR_3$. Anode between the power supply potential line VD and the distributed constant circuit $L_6$ may be connected to the ground potential line GND via a bypass capacitor $C_6$.

The control terminal, that is, the gate of the transistor $TR_3$ is connected to the input terminal 5a of the peak amplifier 5C via a coupling capacitor $C_5$ as a fifth alternating current coupling circuit in an alternating current manner and is isolated from the input terminal 5a in a direct current manner. The total gate width $W_3$ of the transistor $TR_3$ is smaller than the total gate width $W_1$ of the transistor $TR_1$. In one embodiment, the total gate width $W_3$ of the transistor $TR_3$ is half the total gate width $W_1$ of the transistor $TR_1$. A distributed constant circuit $L_4$ is interposed between the control terminal of the transistor $TR_3$ and the coupling capacitor $C_5$. At the control terminal of the transistor $TR_3$, the input signal $S_{in}'$ is received from the input terminal 5a via the coupling capacitor $C_5$ and the distributed constant circuit $L_4$. The input signal $S_{in}$ is a second input signal branched off at the node NA in FIG. 7.

The control terminal of the transistor $TR_3$ is connected to a circuit 13 which applies a bias voltage $VG_3$ (a third bias voltage) to the control terminal. The circuit 13 includes a voltage input terminal 13a, a resistor $R_{13}$, a distributed constant circuit $L_{13}$, and a bypass capacitor $C_{13}$. The voltage input terminal 13a is connected to the control terminal of the transistor $TR_3$ via the distributed constant circuit $L_{13}$ and the resistor $R_{13}$ which are connected in series with each other. A node between the voltage input terminal 13a and the distributed constant circuit $L_{13}$ is connected to the ground potential line GND via the bypass capacitor $C_{13}$. In order to cause the transistor $TR_3$ to perform the class C operation, the bias voltage $VG_3$ is set to such a magnitude that the transistor $TR_3$ is in the pinch-off state when the power of the input signal $S_{in}'$ does not exceed a level $P_1$ (a first level), and the transistor $TR_3$ is in the ON state when the power of the input signal $S_{in}'$ exceeds the level $P_1$. In one embodiment, the bias voltage $VG_3$ is −1 V, and the level $P_1$ is −0.4 V as a value of a voltage between the gate and the source of the transistor $TR_3$. The level $P_1$ is determined based on, for example, a level at which the main amplifier 4 is saturated.

The control terminal of the transistor $TR_1$ of the present embodiment is connected to a current terminal (for example, the drain) of the transistor $TR_3$ on the first node $N_1$ side via the coupling capacitor $C_1$ in an alternating current manner and is isolated from the current terminal of the transistor $TR_3$ in a direct current manner. More specifically, the control terminal of the transistor $TR_1$ is connected to a node $N_3$ between the transistor $TR_3$ and the distributed constant circuit $L_3$ via the coupling capacitor $C_1$ in an alternating current manner and is isolated from the node $N_3$ in a direct current manner. The control terminal of the transistor $TR_1$ receives an input signal $S_{in3}'$, which is a signal after amplification by the transistor $TR_3$, from the node $N_3$ via the coupling capacitor $C_1$.

The control terminal of the transistor $TR_1$ is connected to a circuit 11A which applies a bias voltage $VG_1$ (a first bias voltage) to the control terminal. The circuit 11A includes a voltage input terminal 11a, a resistor $R_{11}$, a distributed constant circuit Ln, and a bypass capacitor Cn. The voltage input terminal 11a is connected to the control terminal of the transistor $TR_1$ via the distributed constant circuit $L_u$ and the resistor $R_{11}$ which are connected in series with each other. A node between the voltage input terminal 11a and the distributed constant circuit $L_{11}$ is connected to the ground potential line GND via the bypass capacitor Cn. In order to cause the transistor $TR_1$ to perform the class C operation, the bias voltage $VG_1$ is set to such a magnitude that the transistor $TR_1$ is in the pinch-off state when the power of the input signal $S_{in3}'$ does not exceed a level $P_2$ (a second level, $P_1 < P_2$), and the transistor $TR_1$ is in the ON state when the power of the input signal $S_{in}'$ exceeds the level $P_2$. In one embodiment, the magnitude of the bias voltage $VG_1$ is the same as the magnitude of the bias voltage $VG_3$.

The control terminal of the transistor $TR_2$ of the present embodiment is connected to the first node $N_1$ via the coupling capacitor $C_2$ in an alternating current manner and is isolated from the first node $N_1$ in a direct current manner. More specifically, the control terminal of the transistor $TR_2$ is connected to a node $N_4$ between the transistor $TR_1$ and the distributed constant circuit $L_2$ via the coupling capacitor $C_2$ in an alternating current manner and is isolated from the node $N_4$ in a direct current manner. The control terminal of the transistor $TR_2$ receives a signal obtained by synthesizing the output signal $S_{in3}$ and the output signal $S_{in2}$ as an input signal $S_{in2}'$ via the coupling capacitor $C_2$. The output signal $S_{in3}$ is a signal after amplification by the transistor $TR_3$ and is obtained from node $N_3$ via the node $N_1$ and the node $N_4$. The output signal $S_{in2}$ is a signal after amplification by the transistor $TR_1$ and is obtained via the node $N_4$.

The control terminal of the transistor $TR_2$ is connected to a circuit 12A which applies a bias voltage $VG_2$ (a second bias voltage) to the control terminal. The circuit 12A includes a voltage input terminal 12a, a resistor $R_{12}$, a distributed constant circuit $L_{12}$, and a bypass capacitor $C_{12}$. The voltage input terminal 12a is connected to the control terminal of the transistor $TR_2$ via the distributed constant circuit $L_{12}$ and the resistor $R_{12}$ which are connected in series with each other. A node between the voltage input terminal 12a and the distributed constant circuit $L_{12}$ is connected to the ground potential line GND via the bypass capacitor $C_{12}$. In order to cause the transistor $TR_2$ to perform the class C operation, the bias voltage $VG_2$ has a magnitude such that the transistor $TR_2$ is in the pinch-off state when the power of the input signal $S_{in2}'$ does not exceed the level $P_1$, and the transistor $TR_2$ is in the ON state when the power of the input signal $S_{in2}'$ exceeds the level $P_1$. In one embodiment, the bias voltage $VG_2$ is 3.6V.

Similar to the first embodiment, the first node $N_1$ is connected to the ground potential line GND via a coupling capacitor $C_3$ in an alternating current manner and is isolated from the ground potential line GND in a direct current manner. A second node $N_2$ between the transistor $TR_2$ and the power supply potential line VD is connected to the output terminal 5b of the peak amplifier 5C via a distributed constant circuit $L_5$ and a coupling capacitor $C_4$ in an alternating current manner and is isolated from the output terminal 5b in a direct current manner. The distributed constant circuit $L_5$ and the coupling capacitor $C_4$ are connected in series with each other. The peak amplifier 5C outputs an amplified output signal $S_{out}$ from the second node $N_2$ via the coupling capacitor $C_4$.

An operation of the peak amplifier 5C having the above-described configuration will be described. When the input signal $S_{in}$ is received at the input terminal 5a, the input signal $S_{in}$ which is a high frequency signal passes through the coupling capacitor $C_5$ and reaches the control terminal of the transistor $TR_3$. The bias voltage $VG_3$ is applied from the circuit 13 to the control terminal of the transistor $TR_3$. Therefore, a voltage obtained by synthesizing the bias voltage $VG_3$ and the high frequency signal component of the input signal $S_{in}$ is applied to the control terminal of the transistor $TR_3$ as the input signal $S_{in}'$. By setting the bias voltage $VG_3$ to an appropriate magnitude, the transistor $TR_3$ is in the pinch-off state and only a small amount of current flows between the current terminals when the power of the input signal $S_{in}'$ does not exceed the level $P_1$. When the power of the input signal $S_{in}'$ exceeds the level $P_1$, the transistor $TR_3$ is in the ON state, and a current corresponding to the magnitude of the input signal $S_{in}'$ flows between the current terminals.

Further, the high frequency component of the voltage applied to the control terminal of the transistor $TR_3$ caused by the input signal $S_{in}'$ is amplified as an output signal $S_{in3}$ and then input as an input signal $S_{in3}'$ from the node $N_3$ to the control terminal of the transistor $TR_1$ through the coupling capacitor $C_1$. An arrow $A_R$ in FIG. 8 shows a flow of such a high frequency component. The bias voltage $VG_1$ is applied to the control terminal of the transistor $TR_1$ from the circuit 11A. Therefore, a voltage obtained by synthesizing the bias voltage $VG_1$ and the amplified high frequency component of the input signal $S_{in3}$ is applied to the control terminal of the transistor $TR_1$ as the input signal $S_{in3}'$. By setting the bias voltage $VG_1$ to an appropriate magnitude, the transistor $TR_1$ is in the pinch-off state and only a small amount of current flows between the current terminals when the power of the input signal $S_{in3}'$ does not exceed the level $P_2$. When the power of the input signal $S_{in3}'$ exceeds the level $P_2$, the transistor $TR_1$ is in the ON state, and a current corresponding to the magnitude of the amplified high frequency component flows between the current terminals.

The high frequency component included in the voltage applied to the control terminal of the transistor $TR_1$ is further amplified by the transistor $TR_1$ and becomes an output signal $S_{in2}$. The output signal $S_{in2}$ is synthesized with the output signal $S_{in3}$, and is input from the node $N_4$ through the coupling capacitor $C_2$ to the control terminal of the transistor $TR_2$ as an input signal $S_{in2}'$ (refer to the arrow $A_{RF}$). The output signal $S_{in3}$ is a signal after amplification by the transistor $TR_3$ and is obtained from node $N_3$ via the node $N_1$ and the node $N_4$. The bias voltage $VG_2$ is applied to the control terminal of the transistor $TR_2$ from the circuit 12A. Therefore, a voltage obtained by synthesizing the bias voltage $VG_2$ and the output signals $S_{in3}$ and $S_{in2}$ is applied to the control terminal of the transistor $TR_2$ as the input signal $S_{in2}'$. The output signals $S_{in3}$ and $S_{in2}$ are high frequency components in which the input signal $S_{in}'$ is amplified. By setting the bias voltage $VG_2$ to an appropriate magnitude, the transistor $TR_2$ is in the pinch-off state and only a small amount of current flows between the current terminals when the power of the input signal $S_{in2}'$ does not exceed the level $P_1$. When the power of the input signal $S_{in2}'$ exceeds the level $P_1$, the transistor $TR_2$ is in the ON state, and a current corresponding to the magnitude of the amplified high frequency component flows between the current terminals.

Since the transistors $TR_1$ and $TR_2$ are connected in series between the power supply potential line VD and the ground potential line GND, a current flowing therethrough is common. Since the transistor $TR_3$ and the transistor $TR_2$ are connected in series between the power supply potential line VD and the ground potential line GND, the current flowing therethrough is common. That is, a magnitude of the current flowing through the transistor $TR_2$ is a sum of a magnitude of the current flowing through the transistor $TR_1$ and a magnitude of the current flowing through the transistor $TR_3$. An arrow $A_{DC}$ in FIG. 8 shows a flow of such a current. The potential of the second node $N_2$ generated by this current includes a high frequency component obtained by amplifying the input signal $S_{in}$ in three stages. This high frequency component passes through the coupling capacitor $C_4$ and is output as an output signal $S_{out}$ from the output terminal 5b to the outside of the peak amplifier 5C, that is, to the node NB shown in FIG. 7. The magnitude of the common current flowing through the transistors $TR_1$ and $TR_2$ is mainly determined by the magnitude of the bias voltage $VG_1$, and the magnitude of the common current flowing through the transistor $TR_3$ and the transistor $TR_2$ is mainly determined by the magnitude of the bias voltage $VG_3$.

The main amplifier 4C shown in FIG. 7 may have the same configuration as the above-described peak amplifier 5C, or may have a configuration different from the peak amplifier 5C. When the main amplifier 4C has the same configuration as the peak amplifier 5C, the magnitude of each of the bias voltages $VG_1$ and $VG_3$ is different from that of the peak amplifier 5C because the main amplifier 4C performs the class A to class AB or class B operations. That is, in order to cause the transistors $TR_1$ and $TR_3$ to perform the class A to class AB or class B operations, the bias voltages $VG_1$ and $VG_3$ have a magnitude such that the transistors $TR_1$ and $TR_3$ are always in the ON state regardless of the power of the input signal $S_{in}$. In one embodiment of the main amplifier 4C, the bias voltages $VG_1$ and $VG_3$ are −0.4V.

FIGS. 9A and 9B, and FIGS. 10A and 10B are diagrams for explaining a specific example of the operation of the peak amplifier 5C. In the drawings, a vertical axis indicating the magnitude of the voltage shows the levels of the bias voltage $VG_3$, the source voltage $VS_3$ of the transistor $TR_3$, the bias voltage $VG_2$, the source voltage $VS_2$ of the transistor $TR_2$, the bias voltage $VG_1$, the source voltage $VS_1$ of the transistor $TR_1$, and the power supply potential line VD. Among these voltages, only the source voltage $VS_2$, the drain voltage $VD_3$, and the drain voltage $VD_1$ are fluctuating values, and the others are fixed values. The source voltage $VS_2$, the drain voltage $VD_3$, and the drain voltage $VD_1$ fluctuate according to the operation states of the transistors $TR_1$, $TR_2$, and $TR_3$. The source voltage $VS_2$ is equal to the drain voltage $VD_3$ of the transistor $TR_3$ and the drain voltage $VD_1$ of the transistor $TR_1$. Here, the bias voltage $VG_1$ has the same value as the bias voltage $VG_3$. The source voltages $VS_1$ and $VS_3$ are, for example, 0V.

FIGS. 9A and 9B, and FIGS. 10A and 10B also show an image of a voltage level of an input waveform of each of the input signal $S_{in}'$ at the control terminal, that is, the gate of the third transistor $TR_3$, the input signal $S_{in3}'$ at the control terminal, that is, the gate of the second transistor $TR_2$, and the input signal $S_{in2}'$ at the control terminal, that is, the gate of the first transistor $TR_1$. Additionally, as a result, the levels of the voltage Vg3s3 applied between the gate and source of the third transistor $TR_3$, the voltage Vg2s2 applied between the gate and source of the second transistor $TR_2$, and the voltage Vg1s1 applied between the gate and source of the first transistor $TR_1$ are shown with arrows.

Figures 9A, 9B:
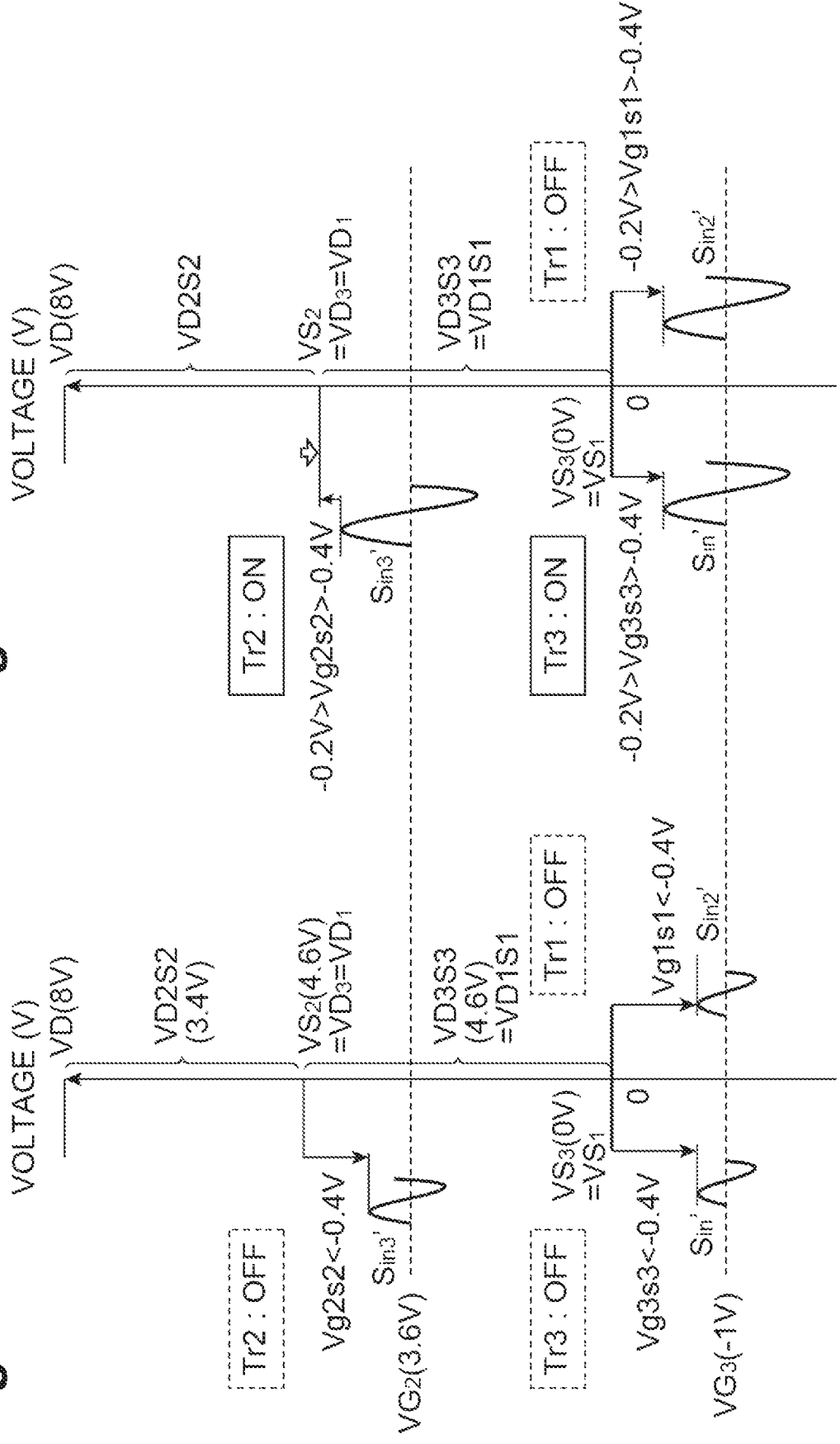
FIGS. 9A and 9B are diagrams for explaining a specific example of an operation of the peak amplifier.

FIG. 9A shows a case in which the power of the input signal $S_{in}$ to the peak amplifier 5C is low. FIG. 9B shows a case in which the power of the input signal $S_{in}$ to the peak amplifier 5C starts to increase and a current starts to flow through the transistor $TR_3$. FIG. 10A shows a case in which the power of the input signal $S_{in}$ to the peak amplifier 5C is further increased and the current also starts to flow through the transistor $TR_1$. FIG. 10B shows a case in which the power of the input signal $S_{in}$ to the peak amplifier 5C is increased and the peak amplifier 5C is completely in the ON state.

As shown in FIG. 9A, when the power of the input signal $S_{in}$ to the peak amplifier 5C is low, the power of each of the input signal $S_{in}'$, the input signal $S_{in2}'$, and the input signal $S_{in3}'$ is also low. Since the bias voltages $VG_1$ and $VG_3$ are set so that the transistors $TR_3$, $TR_2$ and $TR_1$ are in the pinch-off state, the current of the transistors $TR_3$, $TR_2$ and $TR_1$ flows only slightly. In FIG. 9A, the level $P_1$ (the first level) which is a boundary of whether or not the transistors $TR_3$ and $TR_2$ are in the pinch-off state is determined by whether or not the voltage between the gate and the source of each of the transistors $TR_3$ and $TR_2$ is larger than −0.4V. In FIG. 9A, since Vg3s3<−0.4V and Vg2s2<−0.4V, it can be said that the transistors $TR_3$ and $TR_2$ are in the pinch-off state.

Similarly, the level $P_2$ (the second level) which is a boundary of whether or not the transistor $TR_1$ is in the pinch-off state is determined by whether or not the voltage between the gate and the source of the transistor $TR_1$ is larger than −0.2V. In FIG. 9A, since Vg1s1<−0.4V, it can be said that the transistor $TR_1$ is also in the pinch-off state.

At this time, in the current of the transistors $TR_3$, $TR_2$ and $TR_1$ which flow slightly therethrough, a relationship in which a drain current $ID_2$ of the transistor $TR_2$ is equal to a sum ($ID_3+ID_1$) of a drain current $ID_3$ of the transistor $TR_3$ and a drain current $ID_1$ of the transistor $TR_1$ is maintained. The input signals $S_{in}'$, $S_{in3}'$ and $S_{in2}'$ applied to the gates of the transistors $TR_3$, $TR_2$ and $TR_1$ are determined according to the input signal $S_{in}$ input from the input terminal 5a. Subsequently, a source voltage $VS_2$ of the transistor $TR_2$ is determined so that the relationship of $ID_2=ID_3+ID_1$ is maintained between the drain currents of the transistors $TR_3$, $TR_2$ and $TR_1$. That is, the voltage VD2S2 between the drain and the source of the transistor $TR_2$, the voltage VD3S3 between the drain and the source of the transistor $TR_3$, and the voltage VD1S1 between the drain and the source of the transistor $TR_1$ are determined.

After that, when the power of the input signal $S_{in}$ to the peak amplifier 5C starts to increase, the power of each of the input signal $S_{in}'$, the input signal $S_{in2}'$, and the input signal $S_{in3}'$ also starts to increase. As shown in FIG. 9B, when −0.2V>Vg3s3>−0.4V and −0.2V>Vg2s2>−0.4V with respect to the level $P_1$ (−0.4V) and the level $P_2$ (−0.2V), the transistors $TR_3$ and $TR_2$ change from the pinch-off state to the ON state, and the drain currents $ID_3$ and $ID_2$ start to flow.

Since −0.2V>Vg1s1>−0.4V, the transistor $TR_1$ still remains in the pinch-off state, and only a small amount of drain current $ID_1$ flows. However, since the relationship of $ID_2=ID_3+ID_1$ is maintained between the drain currents of the transistors $TR_3$, $TR_2$ and $TR_1$, the source voltage $VS_2$ of the transistor $TR_2$ is determined so that the drain currents $ID_2$, $ID_3$ and $ID_1$ corresponding to the input signals $S_{in}'$, $S_{in3}'$ and $S_{in2}'$ applied to each of the gates flow. That is, the voltage VD2S2 between the drain and the source of the transistor $TR_2$, the voltage VD3S3 between the drain and the source of the transistor $TR_3$, and the voltage VD1S1 between the drain and the source of the transistor $TR_1$ are determined.

When compared to FIG. 9A, since the drain current $ID_3$ starts to flow and the drain current $ID_2$ also starts to flow, the potential of the source voltage $VS_2$ is lowered as in FIG. 3B of the first embodiment. However, in the present embodiment, since the total gate width $W_2$ of the transistor $TR_2$ is larger than the total gate width $W_3$ of the transistor $TR_3$, the fluctuation of the source voltage $VS_2$ is smaller than that in the first embodiment.

Additionally, when the power of the input signal $S_{in}$ to the peak amplifier 5C is further increased, the power of each of the input signal $S_{in}'$, the input signal $S_{in2}'$, and the input signal $S_{in3}'$ is also further increased. As shown in FIG. 10A, when Vg3s3>−0.2V and Vg2s2>−0.2V with respect to the level $P_2$ (−0.2V), the transistors $TR_3$ and $TR_2$ are maintained in the ON state, and the drain currents $ID_3$ and $ID_2$ flow continuously.

Since Vg1s1>−0.2V, the transistor $TR_1$ also changes from the pinch-off state to the ON state, and the drain current $ID_1$ starts to flow. When compared to FIG. 9B, since the drain current $ID_1$ also starts to flow in addition to the drain currents $ID_3$ and $ID_2$, the potential of the source voltage $VS_2$ is further lowered.

Subsequently, when the power of the input signal $S_{in}$ to the peak amplifier 5C is further increased (FIG. 10B), the power of each of the input signal $S_{in}'$, the input signal $S_{in2}'$, and the input signal $S_{in3}'$ is also further increased. The drain current $ID_3$ of the transistor $TR_3$ and the drain current $ID_1$ of the transistor $TR_1$ sufficiently flow, and the potential of the source voltage $VS_2$ is determined so that the drain currents $ID_1$, $ID_2$ and $ID_3$ satisfy $ID_2=ID_1+ID_3$. The potential of the source voltage $VS_2$ is further lowered than that in FIG. 10A. The operation at this time is the same as the operation of the main amplifier 4C when the main amplifier 4C has the same configuration as the peak amplifier 5C.

Like the power amplifier circuit 1B of the present embodiment, the peak amplifier 5C may further include the transistor $TR_3$ connected in parallel with the transistor $TR_1$ between the ground potential line GND and the first node $N_1$, in addition to the configuration of the power amplifier circuit 1A of the first embodiment. In that case, the control terminal of the transistor $TR_3$ may receive the input signal $S_{in}$ via the coupling capacitor $C_5$ and be electrically connected to the circuit 13 which applies the bias voltage $VG_3$ to the control terminal. Then, the control terminal of the transistor $TR_1$ may receive the voltage of the current terminal of the transistor $TR_3$ on the first node $N_1$ side, for example, the drain as an intermediate signal.

In this power amplifier circuit 1B, the current reuse configuration in which the transistors $TR_1$ and $TR_2$ of the peak amplifier 5C are connected in series with each other is formed, and the current reuse configuration in which the transistors $TR_3$ and $TR_2$ are connected in series with each other is formed. Thus, power efficiency can be improved. Also in the present embodiment, the high frequency signal path indicated by the arrow $A_{RF}$ in FIG. 8 and the direct current signal path indicated by the arrow $A_{DC}$ in FIG. 8 are separated from each other. Therefore, the transistor $TR_1$ is immediately linked to the input signal to the transistor $TR_3$, and the transistor $TR_2$ is also immediately linked to the input signal to the transistor $TR_1$. Therefore, the timings at which the transistors $TR_1$, $TR_2$, and $TR_3$ are turned into the ON state can be brought close to each other. In addition, since it is not necessary to make the gate bias of the transistors $TR_1$, $TR_2$ and $TR_3$ shallow, the leakage current can be significantly reduced.

Figure 11:
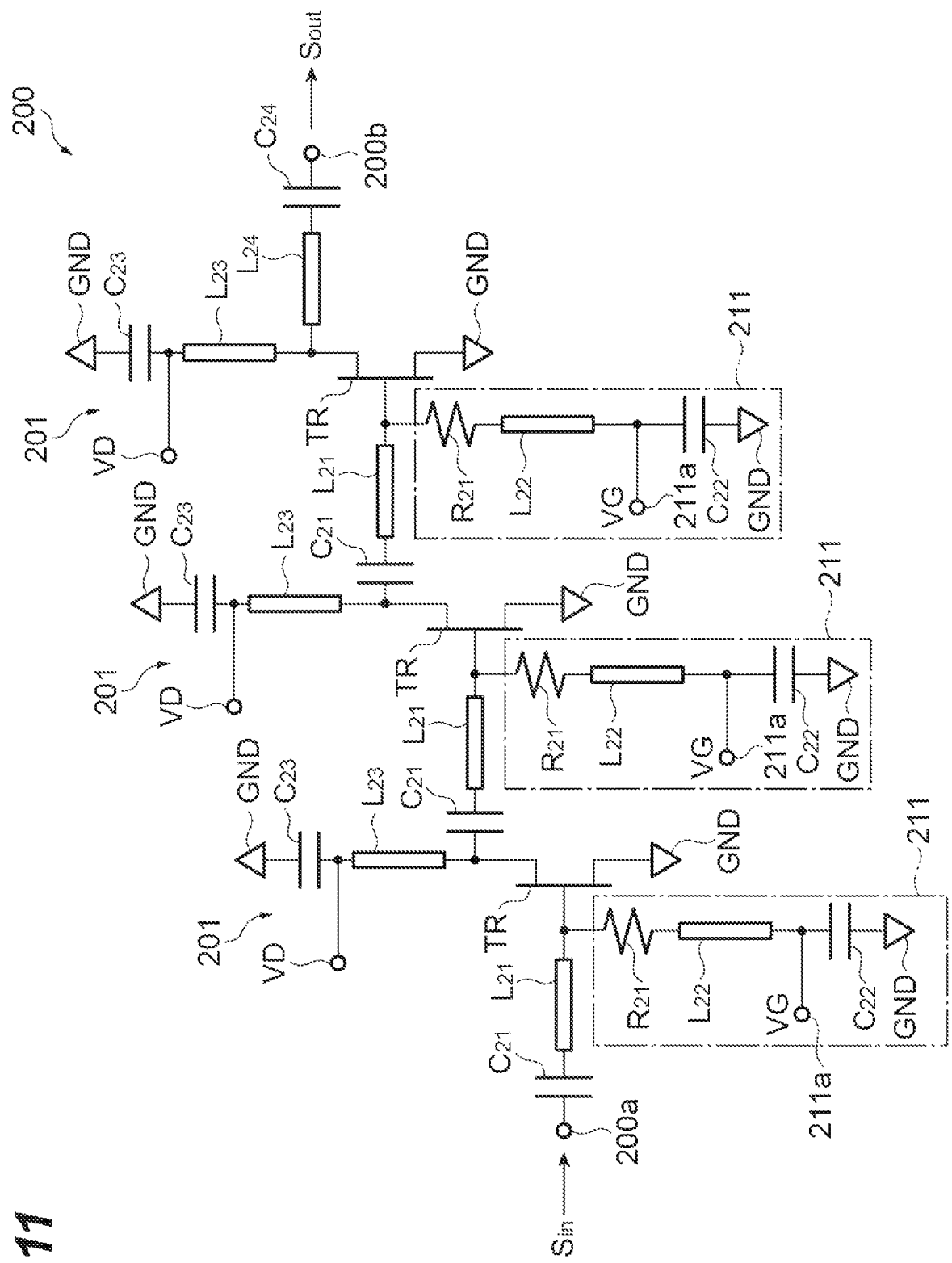
FIG. 11 is a diagram showing an amplifier circuit having a normal three-stage amplifier configuration as a comparative example.

As a comparative example, FIG. 11 shows an amplifier circuit 200 having a three-stage amplifier configuration. The amplifier circuit 200 has a three-stage amplifier unit 201 having the same configuration as each other. The amplifier unit 201 of each of the stages has a source-grounded configuration including a transistor TR. A gate of the first stage transistor TR is connected to a signal input terminal 200a via a distributed constant circuit $L_{21}$ and a coupling capacitor $C_{21}$. Gates of the second-stage and third-stage transistors TR are connected to a drain of the previous-stage transistor TR via the distributed constant circuit $L_{21}$ and the coupling capacitor $C_{21}$. The gate of the transistor TR in each of the stages is connected to a circuit 211 which applies a bias voltage VG to the gate. The circuit 211 of each of the stages has a distributed constant circuit $L_{22}$ and a resistor $R_{21}$ which are connected in series with each other between a bias voltage input terminal 211a and the gate of the transistor TR. Further, the circuit 211 of each of the stages has a bypass capacitor $C_{22}$ connected between the bias voltage input terminal 211a and the ground potential line GND. The source of the transistor TR in each of the stages is connected to the ground potential line GND, and the drain of the transistor TR in each of the stages is connected to the power supply potential line VD via a distributed constant circuit $L_{23}$. A bypass capacitor $C_{23}$ is connected between the power supply potential line VD and the ground potential line GND. The drain of the transistor TR in a third stage, that is, the final stage, is further connected to a signal output terminal 200b via a distributed constant circuit $L_{24}$ and a coupling capacitor $C_{24}$.

Figure 12:
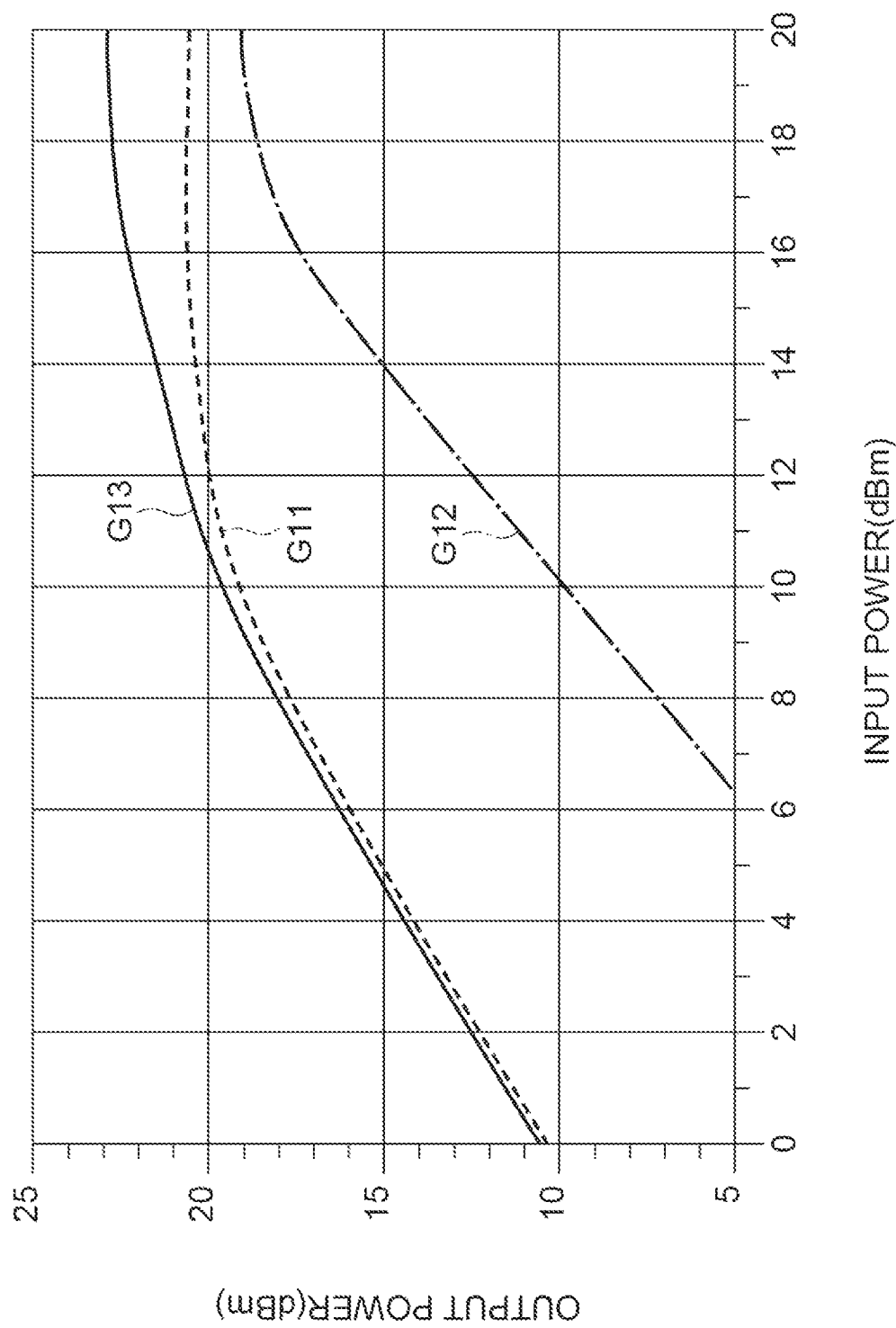
FIG. 12 is a graph showing simulation results regarding input and output characteristics of the power amplifier circuit according to the second embodiment.

FIG. 12 is a graph showing a simulation result regarding input and output characteristics of the power amplifier circuit 1B according to the present embodiment. In FIG. 12, a graph G11 shows the input and output characteristics of the main amplifier 4C, a graph G12 shows the input and output characteristics of the peak amplifier 5C, and a graph G13 shows the input and output characteristics of the entire power amplifier circuit 1B. It is assumed that the main amplifier 4C has the same configuration as the peak amplifier 5C except for the bias voltage. Specific conditions are set as follows.

Input frequency: 73.5 GHz
Power supply potential line VD: 8V (common to main amplifier 4C and peak amplifier 5C)
Bias voltage $VG_1$: Fixed to −0.4V (main amplifier 4C), fixed to −1V (peak amplifier 5C)
Bias voltage $VG_2$: Fixed to 3.6V (main amplifier 4C, peak amplifier 5C)
Bias voltage $VG_3$: Fixed to −0.4V (main amplifier 4C), fixed to −1V (peak amplifier 5C)
Total gate width of transistor $TR_1$: 100 μm (main amplifier 4C, peak amplifier 5C)
Total gate width of transistor $TR_2$: 150 μm (main amplifier 4C, peak amplifier 5C)
Total gate width of transistor $TR_3$: 50 μm (main amplifier 4C, peak amplifier 5C)
Gate length of transistors $TR_1$, $TR_2$ and $TR_3$: 0.1 μm (main amplifier 4C, peak amplifier 5C)

Figure 13:
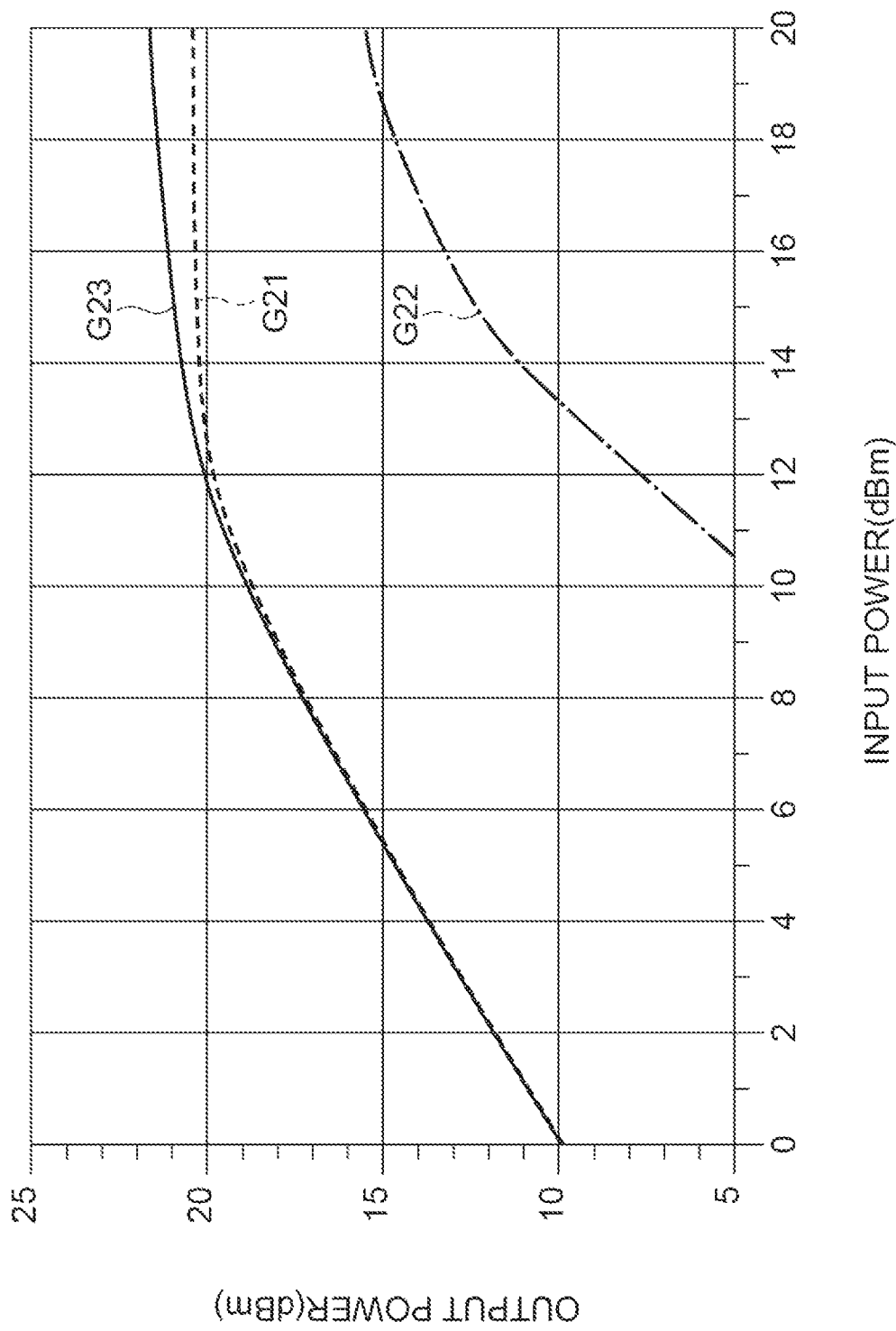
FIG. 13 is a graph showing the simulation results regarding the input and output characteristics of the power amplifier circuit according to a comparative example in which each of the main amplifier and the peak amplifier is the amplifier circuit shown in FIG. 11.

FIG. 13 is a graph showing a simulation result regarding the input and output characteristics of a power amplifier circuit according to a comparative example in which each of the main amplifier and the peak amplifier is the amplifier circuit 200 shown in FIG. 11. In FIG. 13, a graph G21 shows the input and output characteristics of the main amplifier, a graph G22 shows the input and output characteristics of the peak amplifier, and a graph G23 shows the input and output characteristics of the entire power amplifier circuit. In this comparative example, specific conditions are set as follows.

Input frequency: 73.5 GHz
Power supply potential line VD: 4V (common to main amplifier and peak amplifier)
Bias voltage VG: Fixed to −0.4V (main amplifier), fixed to −1V (peak amplifier)
Total gate width of transistor TR: 50 μm (first stage), 100 μm (second stage), 150 μm (third stage) (main amplifier, peak amplifier)
Transistor TR gate length: 0.1 μm (main amplifier, peak amplifier)

With reference to FIGS. 12 and 13, the input and output characteristics of the main amplifier (the graphs G11 and G21) are substantially the same in the present embodiment and the comparative example. On the other hand, regarding the input and output characteristics of the peak amplifier, in the comparative example (the graph G22), a rise of the output power is slow with respect to a rise of the input power, and the output power is saturated with a relatively low power. This is because as the total gate width increases, the input power required for the class C operation also increases. Therefore, this tendency becomes remarkable when the number of stages is increased as in the present embodiment. In order to avoid this problem, when a power monitor circuit (the circuit 13 in FIG. 4B) is provided at the stage in front of the peak amplifier and feedback control is performed for the bias voltage VG in a rear stage (for example, the third stage), the power amplifier circuit becomes complicated, and the upper limit of the input frequency to the power amplifier circuit is limited by an operation speed of the power monitor circuit. When the bias voltage VG of each of the stages is set to be shallow in order to avoid this problem, an influence of a temperature characteristic variation and a process variation of the transistor TR of each of the stages becomes remarkable. In addition, since the leakage current becomes large, there arises a problem that the power efficiency is lowered. On the other hand, in the present embodiment (the graph G12), the rise of the output power with respect to the rise of the input power is faster, and the value at which the output power is saturated can be output to a higher value than those in the comparative example. According to the present embodiment, since the current reuse configuration is adopted, the third-stage transistor $TR_2$ responds according to the input power to the first-stage transistor $TR_3$ and the second-stage transistor $TR_1$, and the current can be increased, and thus it is possible to preferably realize a peak amplifier having high power efficiency and a faster rise of the output power with respect to a rise of the input power even without using the power monitor circuit.

As the current reuse configuration, the power supply of the third-stage transistor $TR_2$ which is the rear stage is supplied to the first-stage transistor $TR_3$ and the second-stage transistor $TR_1$ in parallel with each other via the transistor $TR_2$. Additionally, the level $P_1$ at which the transistor $TR_3$ is turned into the ON state is determined based on the level at which the main amplifier 4C is saturated, whereas the level $P_2$ at which the transistor $TR_1$ is turned into the ON state is set to a value larger than the level $P_1$. The transistor $TR_1$ is turned into the ON state after the main amplifier 4C is saturated and the transistor $TR_3$ is turned into the ON state by setting in this way. As a result, the transistor $TR_1$ can increase the current value of the peak amplifier 5C without lowering the power efficiency while the leakage current is curbed in the pinch-off state. Further, since the timing at which the transistor $TR_1$ is turned into the ON state can be set independently of the timing at which the transistor $TR_3$ is turned into the ON state, the saturation value of the output power of the peak amplifier 5C can be increased.

Figure 14:
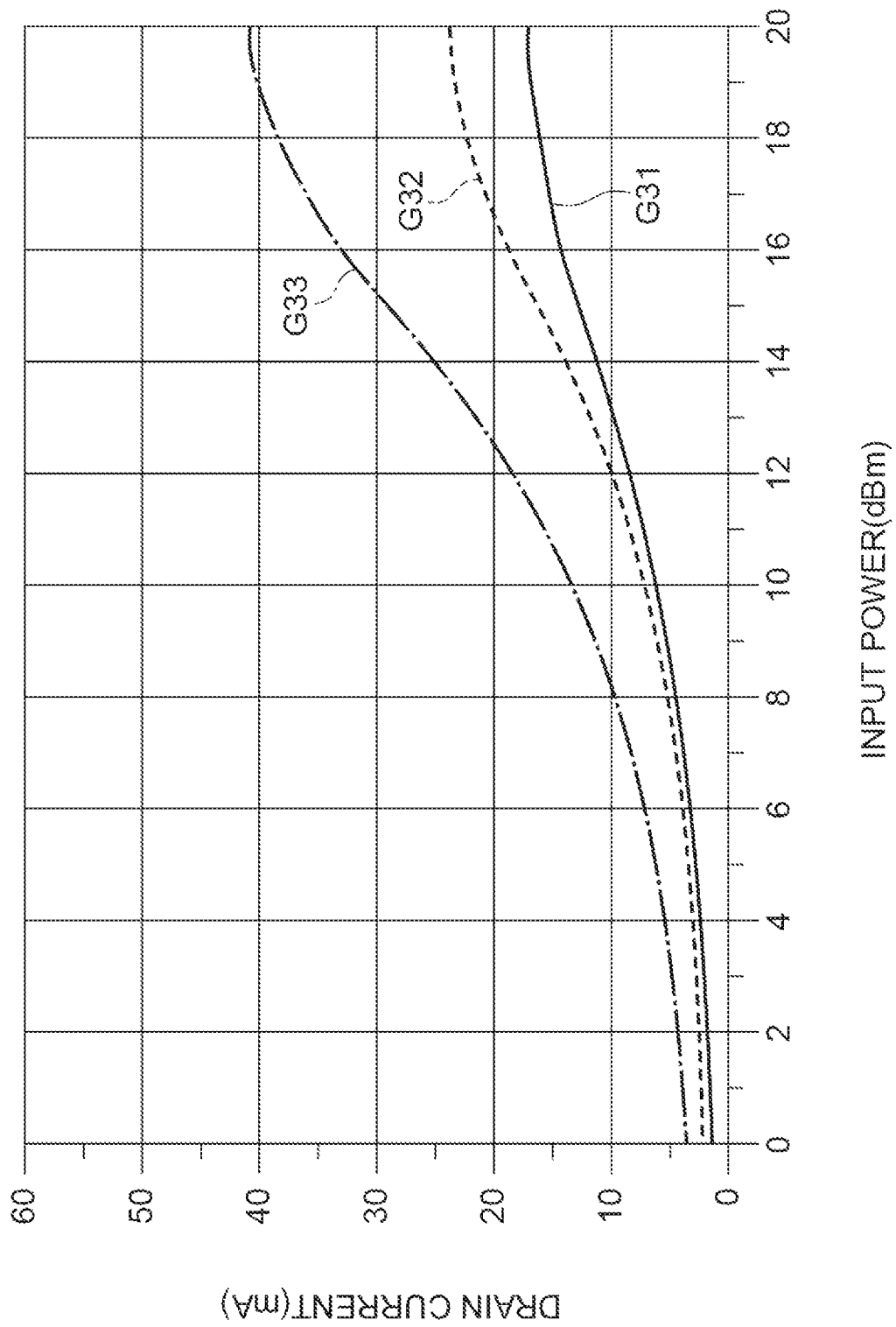
FIG. 14 is a graph showing characteristics of a drain current with respect to input power and shows characteristics of the peak amplifier of the second embodiment.
Figure 15:
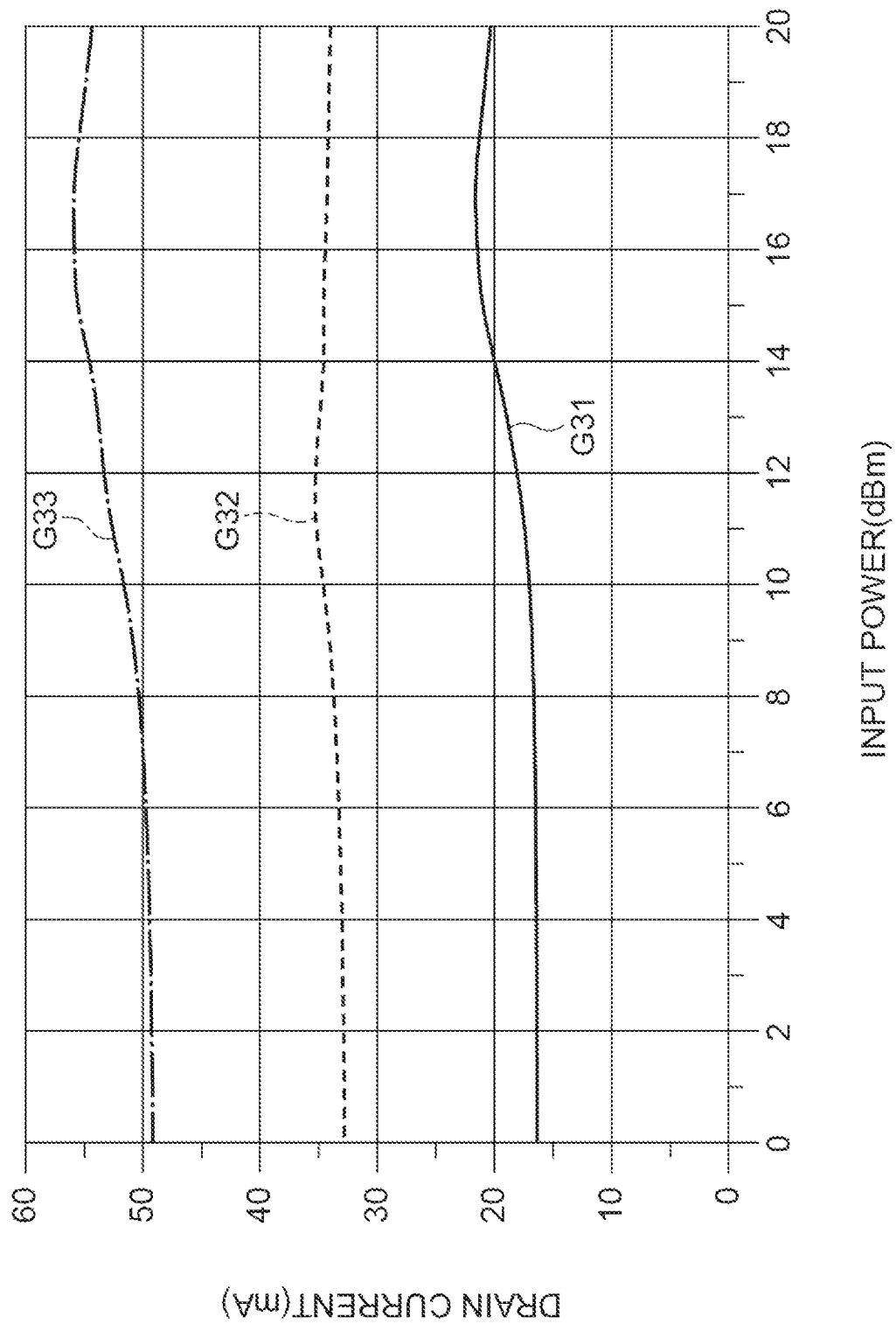
FIG. 15 is a graph showing the characteristics of the drain current with respect to the input power and shows the characteristics of the main amplifier of the second embodiment.
Figure 16:
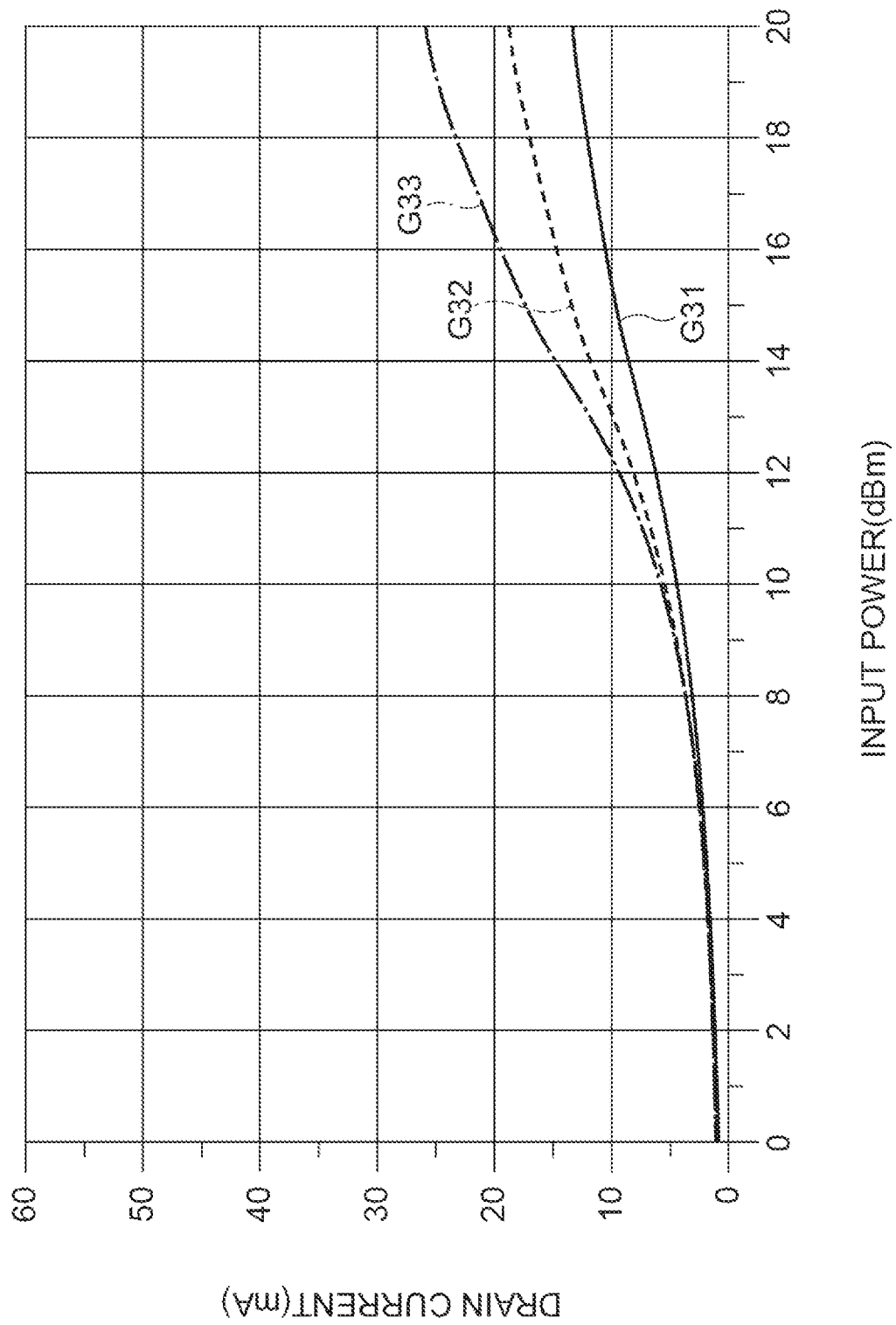
FIG. 16 is a graph showing the characteristics of the drain current with respect to the input power and shows the characteristics of the peak amplifier of the comparative example.
Figure 17:
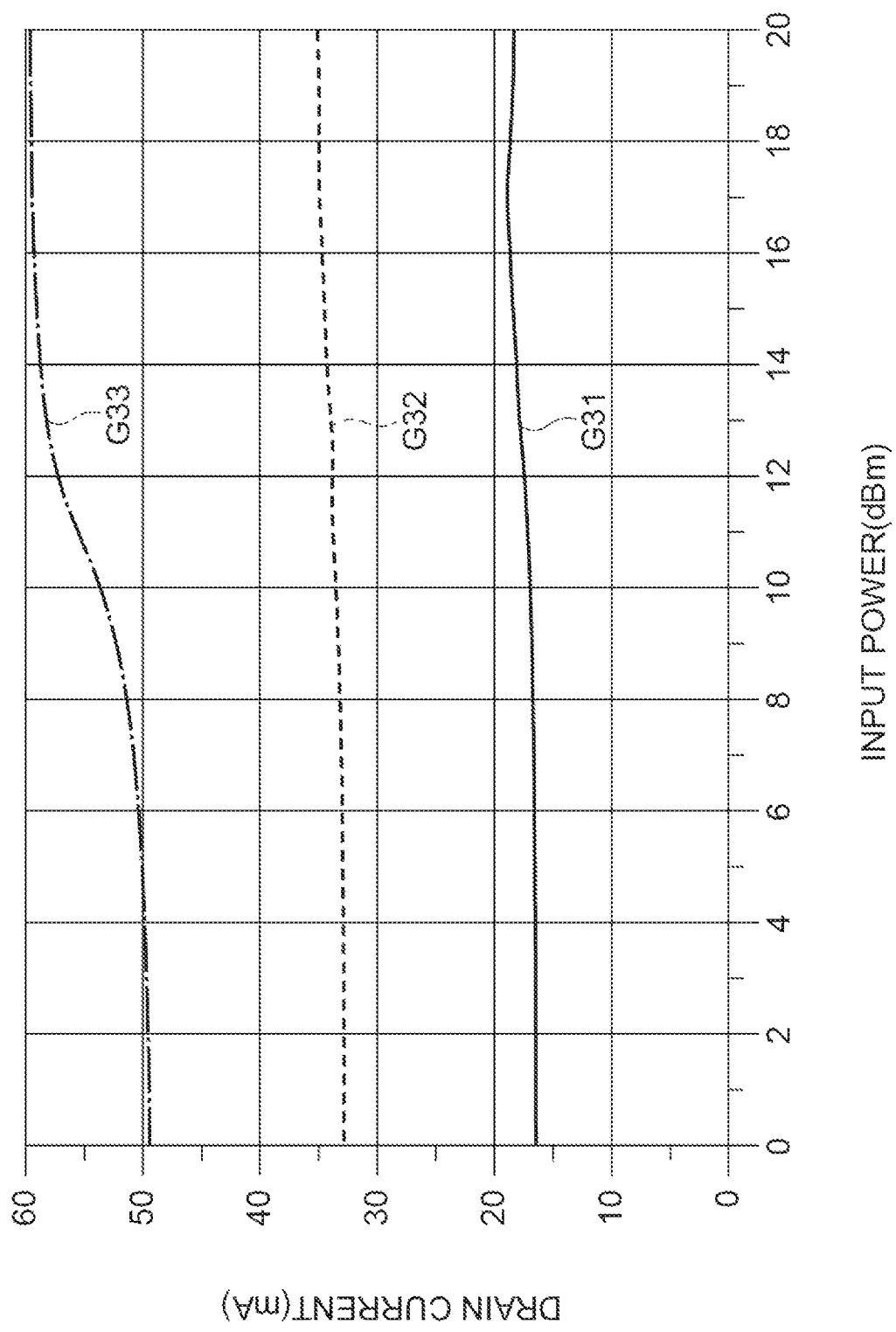
FIG. 17 is a graph showing the characteristics of the drain current with respect to the input power and shows the characteristics of the main amplifier of the comparative example.

FIGS. 14 to 17 are graphs showing the characteristics of the drain current with respect to the input power under the above-described simulation conditions. FIG. 14 shows the characteristics of the peak amplifier 5C of the present embodiment, and FIG. 15 shows the characteristics of the main amplifier 4C of the present embodiment. FIG. 16 shows the characteristics of the peak amplifier according to the comparative example, and FIG. 17 shows the characteristics of the main amplifier according to the comparative example. In each of the drawings, a graph G31 shows the characteristics of the first-stage transistor (the transistor $TR_3$ in the present embodiment), a graph G32 shows the characteristics of the second-stage transistor (the transistor $TR_1$ in the present embodiment), and a graph G33 shows the characteristics of the third-stage transistor (the transistor $TR_2$ in the present embodiment).

When comparing FIGS. 15 and 17, no significant difference is observed between the present embodiment and the comparative example with respect to the main amplifier.

However, when comparing FIGS. 14 and 16, regarding the peak amplifier, the characteristics of the drain current flowing through the third-stage transistor (the graph G33) are significantly different between the present embodiment and the comparative example. That is, in the comparative example (FIG. 16), the rise of the drain current of the third-stage transistor with respect to the rise of the input power is slow, but in the present embodiment (FIG. 14), the rise of the drain current of the third-stage transistor $TR_3$ with respect to the rise of the input power is fast. For example, in the comparative example (FIG. 16), the third-stage drain current finally rises to nearly 10 mA when the input power reaches 12 dBm, but in the present embodiment (FIG. 14), the third stage drain current rises to nearly 10 mA when the input power reaches 8 dBm. Therefore, according to the present embodiment, a peak amplifier for a high frequency signal can be preferably realized.

As described above, the total gate width $W_2$ of the transistor $TR_2$ may be equal to or greater than the sum $(W_1+W_3)$ of the total gate width $W_1$ of the transistor $TR_1$ and the total gate width $W_3$ of the transistor $TR_3$. In this case, the total gate width corresponding to an amount of current flowing through the transistor $TR_2$ can be secured.

As described above, the bias voltage $VG_3$ may be set to such a magnitude that the transistor $TR_3$ is in the pinch-off state when the power of the signal input to the control terminal of the transistor $TR_3$ does not exceed the level $P_1$, and the transistor $TR_3$ is in the ON state when the power of the signal input to the control terminal of the transistor $TR_3$ exceeds the level $P_1$. For example, the class C operation of the transistor $TR_3$ can be performed by setting the bias voltage $VG_3$ in this way.

As described above, the bias voltage $VG_2$ may have such a magnitude that the transistor $TR_2$ is in the pinch-off state when the power of the signal input to the control terminal of the transistor $TR_3$ does not exceed the level $P_1$, and the transistor $TR_2$ is in the ON state when the power of the signal exceeds the level $P_1$. For example, the class C operation of the transistor $TR_2$ can be performed by setting the bias voltage $VG_2$ in this way.

As described above, the bias voltage $VG_1$ may be set to such a magnitude that the transistor $TR_1$ is in the pinch-off state when the power of the signal input to the control terminal of the transistor $TR_1$ does not exceed the level $P_2$, and the transistor $TR_1$ is in the ON state when the power of the signal input to the control terminal of the transistor $TR_1$ exceeds the level $P_2$. For example, the class C operation of the transistor $TR_1$ can be performed by setting the bias voltage $VG_1$ in this way.

The power amplifier circuit according to the present disclosure is not limited to the above-described embodiment, and various other modifications are possible. For example, in the first embodiment, although the transistor $TR_1$ constitutes the first stage transistor, and in the second embodiment, the transistor $TR_3$ constitutes the first stage transistor, the number of stages may be further increased by providing another transistor in the previous stage of each of the transistors. When another transistor is provided in the previous stage of the transistor $TR_3$, a signal based on the input signal $S_{in}$, for example, a signal obtained by amplifying the input signal $S_{in}$ in the previous stage is input to the control terminal of the transistor $TR_3$.

What is claimed is:

1. A power amplifier circuit which is a Doherty type power amplifier circuit including a main amplifier and a peak amplifier to which a first input signal and a second input signal branched off from one input signal are respectively input, and configured to synthesize and output a first output signal from the main amplifier and a second output signal from the peak amplifier,
   wherein the peak amplifier includes:
   a first transistor including a first source terminal, a first drain terminal and a first control terminal, the first source terminal being connected to a first constant potential line, the first drain terminal being connected to a first node connected to the first constant potential line via a third alternating current coupling circuit, the first control terminal being connected to a first bias voltage application circuit configured to apply a first bias voltage to the first control terminal, and the second input signal being input to the first control terminal via a first alternating current coupling circuit; and
   a second transistor including a second source terminal, a second drain terminal and a second control terminal, the second source terminal being connected to the first node, the second drain terminal being connected to a second constant potential line having a higher potential than the first constant potential line, the second control terminal being connected to a second bias voltage application circuit configured to apply a second bias voltage to the second control terminal, and the second control terminal being connected to the first node via a second alternating current coupling circuit, and
   a second node between the second drain terminal and the second constant potential line is connected to a fourth alternating current coupling circuit and outputs the second output signal via the fourth alternating current coupling circuit,
   wherein the first bias voltage has a magnitude such that the first transistor is in a pinch-off state when power of a signal input to the first control terminal does not exceed a first level, and the first transistor is in an ON state when the power of the signal input to the first control terminal exceeds the first level.

2. The power amplifier circuit according to claim 1, wherein the second bias voltage has a magnitude such that the second transistor is in the pinch-off state when the power of the signal input to the first control terminal does not exceed the first level, and the second transistor is in the ON state when the power of the signal input to the first control terminal exceeds the first level.

3. The power amplifier circuit according to claim 1, wherein the first bias voltage application circuit includes a resistor and a voltage input terminal connected to the first control terminal via the resistor.

4. The power amplifier circuit according to claim 1, wherein the second bias voltage application circuit includes a resistor and a voltage input terminal connected to the second control terminal via the resistor.

5. A power amplifier circuit which is a Doherty type power amplifier circuit including a main amplifier and a peak amplifier to which a first input signal and a second input signal branched off from one input signal are respectively input, and configured to synthesize and output a first output signal from the main amplifier and a second output signal from the peak amplifier,
   wherein the peak amplifier includes:
   a first transistor including a first source terminal, a first drain terminal and a first control terminal, the first source terminal being connected to a first constant potential line, the first drain terminal being connected to a first node connected to the first constant potential line via a third alternating current coupling circuit, the first control terminal being connected to a first bias voltage application circuit configured to apply a first bias voltage to the first control terminal, and the second input signal being input to the first control terminal via a first alternating current coupling circuit; and a second transistor including a second source terminal, a second drain terminal and a second control terminal, the second source terminal being connected to the first node, the second drain terminal being connected to a second constant potential line having a higher potential than the first constant potential line, the second control terminal being connected to a second bias voltage application circuit configured to apply a second bias voltage to the second control terminal, and the second control terminal being connected to the first node via a second alternating current coupling circuit, and a second node between the second drain terminal and the second constant potential line is connected to a fourth alternating current coupling circuit and outputs the second output signal via the fourth alternating current coupling circuit, wherein the peak amplifier further includes a third transistor having a third source terminal, a third drain terminal, and a third control terminal, the third source terminal is connected to the first constant potential line, the third drain terminal is connected to the first node, the third control terminal is connected to a third bias voltage application circuit configured to apply a third bias voltage to the third control terminal, the second input signal is input to the third control terminal via a fifth alternating current coupling circuit, the first control terminal is connected to the third drain terminal via the first alternating current coupling circuit, and the second input signal is amplified by the third transistor and is then input to the first control terminal via the first alternating current coupling circuit.

6. The power amplifier circuit according to claim 5, wherein a total gate width of the second transistor is equal to or greater than a sum of a total gate width of the first transistor and a total gate width of the third transistor.

7. The power amplifier circuit according to claim 5, wherein the third bias voltage has a magnitude such that the third transistor is in a pinch-off state when a power of a signal input to the third control terminal does not exceed a first level, and the third transistor is in an ON state when the power of the signal input to the third control terminal exceeds the first level.

8. The power amplifier circuit according to claim 7, wherein the first bias voltage has a magnitude such that the first transistor is in the pinch-off state when a power of a signal input to the first control terminal does not exceed a second level, and the first transistor is in an ON state when the power of the signal input to the first control terminal exceeds the second level, and the second level is greater than the first level.

9. The power amplifier circuit according to claim 5, wherein the third bias voltage application circuit includes a resistor and a voltage input terminal connected to the third control terminal via the resistor.

10. The power amplifier circuit according to claim 8, wherein the third bias voltage application circuit includes a resistor and a voltage input terminal connected to the third control terminal via the resistor.

11. The power amplifier circuit according to claim 5, wherein the first bias voltage application circuit includes a resistor and a voltage input terminal connected to the first control terminal via the resistor.

12. The power amplifier circuit according to claim 5, wherein the second bias voltage application circuit includes a resistor and a voltage input terminal connected to the second control terminal via the resistor.

* * * * *